(12) United States Patent
Taniguchi et al.

(10) Patent No.: US 11,091,830 B2
(45) Date of Patent: Aug. 17, 2021

(54) MOTH-EYE TRANSFER MOLD, METHOD OF MANUFACTURING MOTH-EYE TRANSFER MOLD, AND METHOD OF TRANSFERRING MOTH-EYE STRUCTURE

(71) Applicants: Tokyo University of Science Foundation, Tokyo (JP); GEOMATEC CO., LTD., Kanagawa (JP)

(72) Inventors: Jun Taniguchi, Tokyo (JP); Hiroyuki Sugawara, Miyagi (JP)

(73) Assignees: Tokyo University of Science Foundation, Tokyo (JP); GEOMATEC CO., LTD., Kanagawa (JP)

( * ) Notice: Subject to any disclaimer, the term of this patent is extended or adjusted under 35 U.S.C. 154(b) by 0 days.

(21) Appl. No.: 16/619,154

(22) PCT Filed: Jun. 12, 2019

(86) PCT No.: PCT/JP2019/023295
§ 371 (c)(1),
(2) Date: Dec. 4, 2019

(87) PCT Pub. No.: WO2019/240174
PCT Pub. Date: Dec. 19, 2019

(65) Prior Publication Data
US 2020/0406509 A1    Dec. 31, 2020

(30) Foreign Application Priority Data
Jun. 13, 2018    (JP) .............................. JP2018-113021

(51) Int. Cl.
*C23C 14/06*    (2006.01)
*C23C 14/58*    (2006.01)
(Continued)

(52) U.S. Cl.
CPC ...... *C23C 14/0605* (2013.01); *B29C 33/3842* (2013.01); *B29C 59/022* (2013.01);
(Continued)

(58) Field of Classification Search
CPC ............ C23C 14/0605; C23C 14/5873; B29C 33/3814; B29C 33/3842; B29C 59/022; B29C 59/16; G02B 1/118
See application file for complete search history.

(56) References Cited

U.S. PATENT DOCUMENTS 6,748,959 B1 *    6/2004    Kashiwaya .......... C23C 14/0605
                                                    134/1.1
8,328,371 B2 *    12/2012    Taniguchi .............. G02B 1/118
                                                    359/601
(Continued)

FOREIGN PATENT DOCUMENTS

CN    102859048 A    1/2013
JP    08279500 A *    10/1996
(Continued)

OTHER PUBLICATIONS

Machine Translation JP 08279500 A (Year: 1996).*
(Continued)

*Primary Examiner* — Michael A Band
(74) *Attorney, Agent, or Firm* — Michael Best & Friedrich LLP

(57) ABSTRACT

To provide a moth-eye transfer mold and a method of manufacturing a moth-eye transfer mold that provide a simple and inexpensive manufacturing process. A moth-eye transfer mold 1 is characterized by including a base 10, an underlayer 20 formed on the base 10, and a glassy carbon layer 30 formed on the underlayer 20, the glassy carbon layer 30 has an inverted moth-eye structure RM over a
(Continued)

surface 30a, and the inverted moth-eye structure RM is randomly arranged cone-shaped pores.

3 Claims, 22 Drawing Sheets

(51) Int. Cl.
    *C23C 14/54*     (2006.01)
    *G02B 1/118*     (2015.01)
    *B29C 33/38*     (2006.01)
    *B29C 33/42*     (2006.01)
    *B29C 59/02*     (2006.01)
    *B29C 59/16*     (2006.01)
    *C23C 14/34*     (2006.01)
    *B29L 11/00*     (2006.01)
    *B29L 31/34*     (2006.01)

(52) U.S. Cl.
    CPC .............. *B29C 59/16* (2013.01); *C23C 14/34* (2013.01); *C23C 14/542* (2013.01); *C23C 14/5873* (2013.01); *G02B 1/118* (2013.01); *B29L 2011/00* (2013.01); *B29L 2031/3475* (2013.01)

(56) References Cited

U.S. PATENT DOCUMENTS

| | | | |
|---|---|---|---|
| 10,754,067 B2 * | 8/2020 | Seder | C23C 14/5846 |
| 2009/0323189 A1 | 12/2009 | Taniguchi | |
| 2013/0094089 A1 | 4/2013 | Isurugi et al. | |
| 2013/0200041 A1 * | 8/2013 | Kamata | G11B 3/70 216/22 |
| 2014/0197036 A1 | 7/2014 | Isurugi et al. | |

FOREIGN PATENT DOCUMENTS

| | | |
|---|---|---|
| JP | 2004-137105 A | 5/2004 |
| JP | 2008-233850 A | 10/2008 |
| JP | 2012-183752 A | 9/2012 |
| JP | 2013-039780 A | 2/2013 |
| JP | 5615971 B2 | 10/2014 |
| WO | 2008/018570 A1 | 2/2008 |

OTHER PUBLICATIONS

'Glass-like carbon'. IUPAC Goldbook [Accessed online] [https://goldbook.iupac.org/terms/view/G02639] (Year: 2014).*

Chinese Office Action dated Jul. 27, 2020 from the State Intellectual Property Office of China (SIPO) for the related Chinese patent application No. 201980002307.6, with English translation.

Korean Office Action dated Dec. 7, 2019 for the corresponding Korean patent application No. 10-2019-7033097, with machine English translation.

International Search Report dated Sep. 10, 2019 for the corresponding PCT Application No. PCT/JP2019/023295, with translation.

Japanese Office Action dated Sep. 25, 2018 for the corresponding Japanese Patent Application No. 2018-113021, with translation.

* cited by examiner

BEFORE ETCHING STEP

AFTER ETCHING STEP

BEFORE ETCHING STEP

AFTER ETCHING STEP

SURFACE 45 DEGREE TILT

SURFACE NO TILT

SECTION

SURFACE 45 DEGREE TILT

SURFACE NO TILT

SECTION

SURFACE 45 DEGREE TILT

SURFACE NO TILT

SECTION

SURFACE 45 DEGREE TILT

SURFACE NO TILT

SECTION

SURFACE 45 DEGREE TILT

SURFACE NO TILT

SECTION

SURFACE
45 DEGREE
TILT

SURFACE
NO TILT

SURFACE 45 DEGREE TILT

SURFACE NO TILT

SURFACE
45 DEGREE
TILT

SURFACE
NO TILT

SURFACE 45 DEGREE TILT

SURFACE NO TILT

SURFACE
45 DEGREE
TILT

SURFACE
NO TILT

MOTH-EYE TRANSFER MOLD, METHOD OF MANUFACTURING MOTH-EYE TRANSFER MOLD, AND METHOD OF TRANSFERRING MOTH-EYE STRUCTURE

CROSS-REFERENCE TO RELATED APPLICATIONS

This application is entering the National Stage of International Application No. PCT/JP2019/023295, filed Jun. 12, 2019. Further, this application claims priority from Japanese Patent Application JP 2018-113021, filed Jun. 13, 2018, the entire contents of which are hereby incorporated into this application.

TECHNICAL FIELD

The present invention relates to a moth-eye transfer mold, a method of manufacturing a moth-eye transfer mold, and a method of transferring a moth-eye structure.

BACKGROUND ART

Display devices for use in televisions, smartphones, tablet devices, etc., and optical elements such as camera lenses usually adopt an antireflection technique in order to reduce surface reflection and increase the amount of light transmitted therethrough.

As an antireflection technique, a method of forming over a substrate surface a minute uneven pattern, in which the pitch of recessed portions or raised portions is controlled to be not more than the wavelength of visible light ($\lambda$=380 nm to 780 nm), has been received attention. This method utilizes the principle of a so-called moth-eye (Motheye, eyes of moths) structure. The refractive index for light that is incident on the substrate is continuously changed along the depth direction of the recessed portions or the raised portions, from the refractive index of a medium on which the light is incident to the refractive index of the substrate, whereby reflection in a wavelength region that is subject to antireflection is prevented.

The moth-eye structure is advantageous in that it is capable of exhibiting an antireflection function with small incident angle dependence over a wide wavelength region, as well as that it is applicable to a number of materials, and that an uneven pattern can be directly formed in a substrate. Consequently, a high-performance antireflection film (or an antireflection surface) can be provided at a low cost.

As a method of manufacturing a moth-eye structure transfer mold (transfer plate), there is a method including: a step of partially anodizing an aluminum alloy layer to form a porous alumina layer which has a plurality of minute recessed portions; after the step, a step of bringing the porous alumina layer into contact with an etching solution, thereby enlarging the plurality of minute recessed portions of the porous alumina layer; and after the step, a step of further performing anodization to grow the plurality of minute recessed portions (Patent Literature 1).

CITATION LIST

Patent Literature

PATENT LITERATURE 1: JP 5615971 B2

SUMMARY OF INVENTION

Technical Problem

The method of manufacturing a moth-eye structure transfer mold described in Patent Literature 1 is a multistep process of repeatedly performing a step of anodizing the aluminum alloy layer to form the porous alumina layer, and after the anodization, a step of etching, which results in a long manufacturing cycle time.

The present invention was made in view of the above problem. An object of the present invention is to provide a method of manufacturing a moth-eye transfer mold and a moth-eye transfer mold which provide a simpler and less expensive manufacturing process than the related art.

Another object of the present invention is to provide a method of transferring a moth-eye structure with the use of a moth-eye transfer mold which provides a simpler and less expensive manufacturing process than the related art.

Solution to Problem

The above problem is solved by a moth-eye transfer mold according to the present invention including: a base; an underlayer formed on the base; and a glassy carbon layer formed on the underlayer, the glassy carbon layer has an inverted moth-eye structure over its surface, and the inverted moth-eye structure is randomly arranged cone-shaped pores.

According to the above configuration, the material and shape of the base can be freely selected, and the area of the inverted moth-eye structure can be increased.

In the configuration, preferably, the base comprises one or more substances selected from the group consisting of resin, glass, metal, alloy, ceramics, a silicon wafer, a compound semiconductor, silicon carbide, and a solar cell material.

In the configuration, preferably, the underlayer comprises one or more substances selected from the group consisting of metal, alloy, ceramics, and silicon.

In the configuration, preferably, in the glassy carbon layer, a glassy carbon microstructure constituting the inverted moth-eye structure has an average diameter of 10 nm to 400 nm, an average height of 30 nm to 1,000 nm, and an average pitch of 10 nm to 500 nm.

In the configuration, preferably, the moth-eye transfer mold has a shape comprising one or more shapes selected from the group consisting of a roll shape, a flat plate shape, and an irregular shape.

The above problem is solved by a method of manufacturing a moth-eye transfer mold according to the present invention including: a base preparation step of preparing a base; an underlayer forming step of forming an underlayer on the base; a glassy carbon layer deposition step of depositing a glassy carbon layer on the underlayer by a sputtering method; and an etching step of etching the glassy carbon layer with an oxygen ion beam or oxygen plasma.

According to the above configuration, a manufacturing process is simple and inexpensive, the material and shape of the base can be freely selected, and the area of the inverted moth-eye structure can be increased.

In the configuration, preferably, in the glassy carbon layer deposition step, sputtering power is not less than 0.5 kW and not more than 5 kW, and deposition pressure is 1.0 Pa or less.

In the configuration, preferably, in the etching step, high frequency power output is not less than 200 W and not more than 1,000 W, bias power output is not less than 0 W and not more than 100 W, and processing time is not less than 30 seconds and not more than 500 seconds.

The above problem is solved by a method of manufacturing a moth-eye transfer mold according to the present invention including: a moth-eye transfer mold preparation step of preparing the moth-eye transfer mold; a step of preparing a work; a step of irradiating a photocurable resin with light, with the photocurable resin interposed between the moth-eye transfer mold and a surface of the work, thereby curing the photocurable resin; and a step of peeling off the moth-eye transfer mold from a surface microstructure which is formed by the cured photocurable resin.

According to the configuration, it is possible to transfer a surface microstructure (moth-eye structure) with ultra-low reflection and high antifouling effect to the work. In addition, when transferring directly to the work, it is possible to reduce the reflectance resulting from a film base which causes a problem when attaching a film provided with a moth-eye structure.

Advantageous Effects of Invention

According to a method of manufacturing a moth-eye transfer mold and a moth-eye transfer mold according to the present invention, a manufacturing process is simpler and less expensive than the related art, the material and shape of the base can be freely selected, and the area of the inverted moth-eye structure can be increased.

In addition, according to a method of transferring a moth-eye structure, it is possible to transfer the surface microstructure (moth-eye structure) with ultra-low reflection and high antifouling effect to the work.

DESCRIPTION OF EMBODIMENTS

Hereinafter, a moth-eye transfer mold, a method of manufacturing a moth-eye transfer mold, a method of transferring a moth-eye structure, and an article provided with a surface microstructure according to an embodiment of the present invention (hereinafter, referred to as present embodiment) will be described with reference to FIGS. 1 to 25.

<Moth-Eye Transfer Mold 1>

Figure 1:
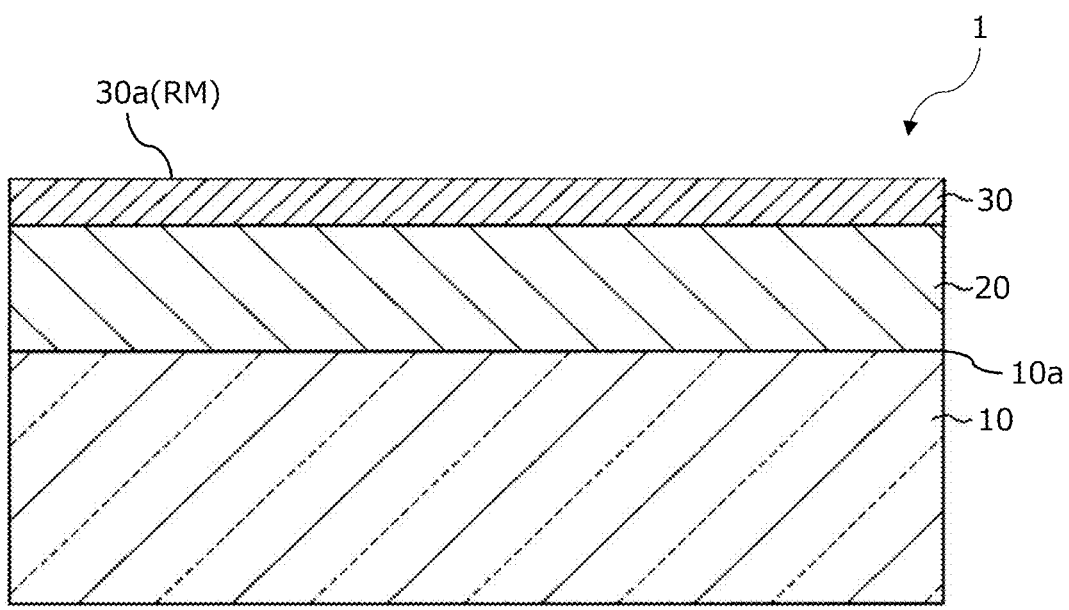
FIG. 1 is a schematic cross-sectional view showing a moth-eye transfer mold according to an embodiment of the present invention.

A moth-eye transfer mold 1 according to the present embodiment, as shown in FIG. 1, includes a base 10, an underlayer 20 formed on the base 10, and a glassy carbon layer 30 formed on the underlayer 20. The glassy carbon layer 30 has an inverted moth-eye structure RM over a surface 30a.

(Base 10)

The base 10 comprises one or more substances selected from the group consisting of resin, rubber, glass, metal, alloy, ceramics (metal oxide, metal nitride, and metal oxynitride), a silicon wafer (Si wafer), a compound semiconductor for use in a compound semiconductor substrate, silicon carbide (SiC) for use in a substrate for a power device, and a solar cell material such as silicon.

As the base 10, a flexible material such as rubber is preferably adopted since, when a moth-eye structure is transferred with the use of the moth-eye transfer mold 1, the moth-eye transfer mold 1 can be brought into close contact with even a curved or irregular-shaped article (work) along the shape of the article.

(Underlayer 20)

The underlayer 20 comprises one or more substances selected from the group consisting of metal, alloy, ceramics (metal oxide, metal nitride, and metal oxynitride), and silicon (Si).

The film thickness of the underlayer 20 is preferably not less than 10 nm and not more than 500 nm.

When a material containing resin (plastic or film) is adopted as the base 10, the underlayer 20 of Cr, Ti, $Ta_2O_5$, the combination thereof, etc., is preferably used.

The table 1 below shows a desirable combination of the material of the base 10 and the underlayer 20. The underlayer is added to a surface of the base 10, thereby improving the adhesion of the glassy carbon layer 30 and enabling the prevention of film cracks in the glassy carbon layer 30.

TABLE 1

| Base | Glass | Metal | Resin or Film |
|---|---|---|---|
| Underlayer | Cr, Ti | Cr, Ti | Cr, Ti, Ti/$Ta_2O_5$, Cr/$Ta_2O$ |

(Glassy Carbon Layer 30)

The glassy carbon layer 30 is a layer formed on the underlayer 20 and containing glassy carbon.

Glassy carbon is glass-like carbon that is black in appearance, and has a homogenous and dense structure. The glassy carbon has the conductivity, the chemical stability, the heat resistance, the high purity, etc. which are the characteristics similar to the other carbon materials, as well as having such excellent characteristics that the material surface is not powdered to be fallen off. As general properties of the glass-like carbon, it is lightweight with a density of 1.45 $g/cm^3$ to 1.60 $g/cm^3$, it has high strength with a bending strength of 50 MPa to 200 MPa, and it is resistant to acids such as a sulfuric acid and a hydrochloric acid and has corrosion resistance. As other characteristics, in terms of conductivity, specific electric resistance is 4 mΩcm to 20 mΩcm, which is slightly higher than that of graphite, and gas permeability is $10^{-9}$ $cm^2/s$ to $10^{-12}$ $cm^2/s$, which is extremely low.

The film thickness of the glassy carbon layer 30 is preferably not less than 300 nm and not more than 5 μm.

The glassy carbon layer 30 has the inverted moth-eye structure RM over its surface 30*a*.

The inverted moth-eye structure refers to a surface structure of a moth-eye transfer mold which is capable of forming a moth-eye structure.

In the moth-eye transfer mold 1 according to the present embodiment, the inverted moth-eye structure RM is formed by randomly arranged conical pores. A grassy carbon microstructure constituting the inverted moth-eye structure RM has an average diameter (D) of 10 nm to 400 nm, preferably 30 nm to 300 nm, and particularly preferably 50 nm to 150 nm, an average height (H) of 30 nm to 1,000 nm, preferably 50 nm to 700 nm, and particularly preferably 100 nm to 500 nm, and an average pitch (P) of 10 nm to 500 nm, preferably 30 nm to 400 nm, and particularly preferably 50 nm to 300 nm.

The shape of the moth-eye transfer mold 1 comprises one or more shapes selected from the group consisting of a roll shape, a flat plate shape, and an irregular shape.

<Method of Manufacturing Moth-Eye Transfer Mold>

Figure 2:
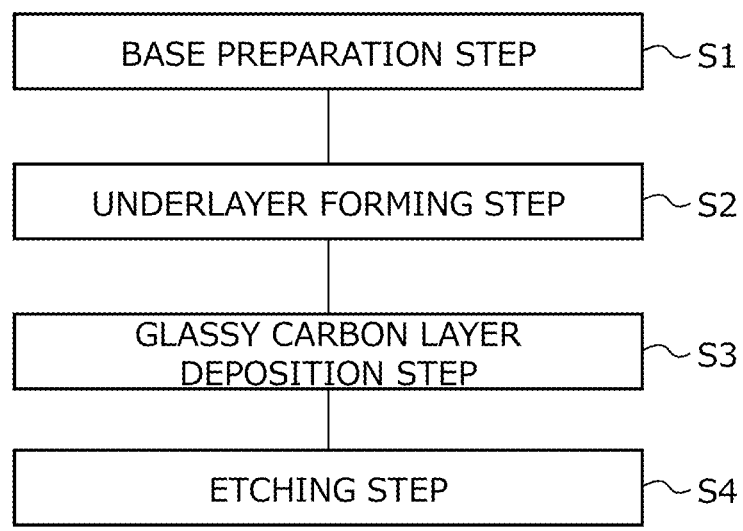
FIG. 2 is a flowchart showing a method of manufacturing a moth-eye transfer mold according to an embodiment of the present invention.

As shown in FIG. 2, the moth-eye transfer mold 1 according to the present embodiment is manufactured by the following method of manufacturing a moth-eye transfer mold.

Specifically, the method of manufacturing a moth-eye transfer mold according to the present embodiment is characterized by performing a base preparation step (step S1) of preparing the base 10, an underlayer forming step (step S2) of forming the underlayer 20 on the base 10, a glassy carbon layer deposition step (step S3) of depositing the glassy carbon layer 30 on the underlayer 20 by a sputtering method, and an etching step (step S4) of etching the glassy carbon layer 30 with oxygen plasma.

The moth-eye transfer mold 1 can be obtained by the above steps S1 to S4.

Each step will be described in detail below.

(Base Preparation Step)

In the base preparation step (step S1), the base 10 is prepared. In advance, a pretreatment for improving the deposition performance (lamination performance) of the underlayer 20 may be performed, such as washing a surface 10*a* of the base 10 or performing a charging treatment.

(Underlayer Forming Step)

In the underlayer forming step (step S2), the underlayer 20 is formed on the base 10. Depending on such as the materials of the base 10 and the underlayer 20, a sputtering method, an ion plating method, a vacuum deposition method, a chemical deposition method, etc., can be used, but the present invention is not limited to these methods.

(Glassy Carbon Layer Deposition Step)

In the glassy carbon layer deposition step (step S3), the glassy carbon layer 30 is deposited on the underlayer 20 by a sputtering method. The output condition is preferably DC power supply.

When the glassy carbon layer deposition step is performed by a sputtering method with the DC power supply, by setting sputtering power, deposition pressure, etc. to the appropriate conditions, the glassy carbon layer having a small grain boundary and a high film density can be deposited.

Specifically, the sputtering power may be not less than 0.5 kW and not more than 5 kW, preferably not less than 1.0 kW and not more than 3.0 kW, and more preferably not less than 1.0 kW and not more than 2.0 kW, and the deposition pressure may be 1.0 Pa or less, preferably $8\times10^{-1}$ Pa or less, and more preferably $5\times10^{-1}$ Pa.

(Etching Step)

In the etching step (step S4), the glassy carbon layer 30 is etched with an oxygen ion beam or oxygen plasma. Furthermore, in order to increase ionization efficiency and plasma density, gas which is likely to ionize, such as argon, may be mixed. The type of gas is not limited to argon.

The etching step can be performed with an electron cyclotron resonance (ECR) or inductively coupled plasma (ICP) type ion beam processing apparatus (plasma etching apparatus).

First, a sample on which the glassy carbon layer is deposited in the glassy carbon layer deposition step is set in a holder of the ion beam processing apparatus or the plasma etching apparatus. The shape of the sample to be used may be not only a plate shape but also a shape such that a surface on which ion beam processing is to be performed is a curved surface.

After the sample is placed in the ion beam processing apparatus or the plasma etching apparatus, a reactive gas is introduced and a predetermined acceleration voltage is applied to perform ion beam processing on the surface 30a of the glassy carbon layer 30.

As a reactive gas, gas containing oxygen may be used, only oxygen may be used, or a mixture of oxygen and a CF-based gas such as $CF_4$ may be used. In addition, in order to change an ion current density or a plasma density, a rare gas such as argon may be mixed.

In this way, by performing ion beam processing on the surface 30a of the glassy carbon layer 30, it is possible to form a group of minute protrusions (a microstructure) having a shape that decreases in diameter toward the tip, such as a needle shape. Furthermore, by controlling especially acceleration voltage, a gas flow rate, and processing time, the shape (size, width, angle, etc.) and pitch of the protrusions can be controlled.

Specifically, high frequency power output and bias power output are adjusted to apply acceleration voltage to ions. The high frequency power output may be not more than 200 W and not less than 1,000 W, preferably not more than 300 W and not less than 700 W, and more preferably not more than 400 W and not less than 600 W, and the bias power output may be not more than 0 W and not less than 100 W, preferably not more than 30 W and not less than 70 W, and more preferably not more than 40 W and not less than 60 W.

When oxygen gas is used as the reactive gas, the gas flow rate may be preferably not more than 10 SCCM and not less than 100 SCCM, preferably not more than 20 SCCM and not less than 80 SCCM, more preferably not more than 25 SCCM and not less than 70 SCCM, and particularly preferably not more than 30 SCCM and not less than 60 SCCM (SCCM: gas flow rate converted at 1 atm, 25° C., cc/min).

The processing time may be not more than 30 seconds and not less than 500 seconds, preferably not more than 50 seconds and not less than 400 seconds, more preferably not more than 60 seconds and not less than 300 seconds, and particularly preferably not more than 80 seconds and not less than 190 seconds.

Preferably, the ion current density and the plasma density are temporally stabilized, since the height of the moth-eye shape can be easily controlled, and uniform processing can be performed.

In addition, when the ECR or ICP type ion beam processing apparatus is used, even a relatively large surface can be processed at once. According to this method, the surface of the glassy carbon layer 30 can be easily processed, and the moth-eye transfer mold 1 for transferring an antireflective structure capable of exhibiting a high antireflective effect can be manufactured.

The moth-eye structure RM (the surface 30a of the glassy carbon layer 30) of moth-eye transfer mold 1 obtained in this manner can undergo mold release treatment.

<Method of Transferring Moth-Eye Structure>

Figure 3:
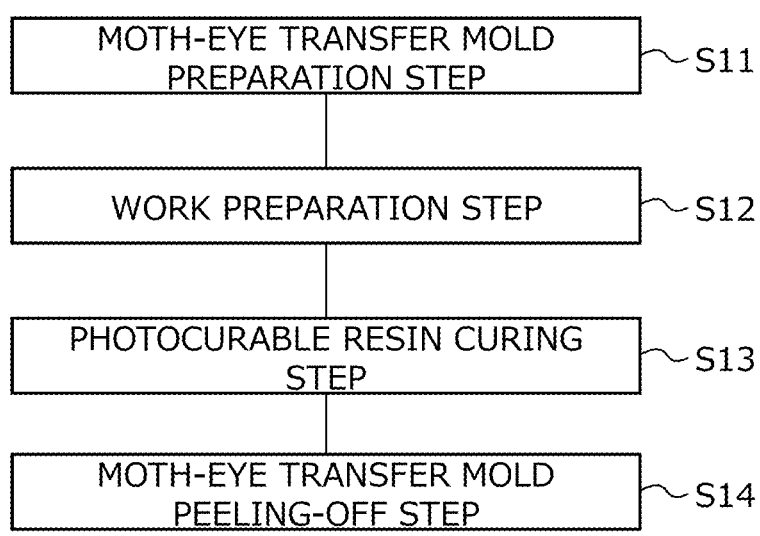
FIG. 3 is a flowchart showing a method of transferring a moth-eye structure according to an embodiment of the present invention.

Using the moth-eye transfer mold 1 according to the present embodiment, a moth-eye structure can be transferred to a surface of a work as shown in FIG. 3.

Specifically, a method of transferring a moth-eye structure according to the present embodiment is characterized by performing a moth-eye transfer mold preparation step (step S11) of preparing a moth-eye transfer mold, a step (step S12) of preparing a work, a step (step S13) of irradiating a photocurable resin with light, with the photocurable resin interposed between the moth-eye transfer mold and a surface of the work, thereby curing the photocurable resin, and a step (step S14) of peeling off the moth-eye transfer mold from a surface microstructure which is formed by the cured photocurable resin.

Through the above steps S11 to S14, the moth-eye structure can be transferred to the surface of the work.

Each step will be described in detail below.

(Moth-Eye Transfer Mold Preparation Step)

In the moth-eye transfer mold preparation step (step S11), the moth-eye transfer mold 1 shown in FIG. 1, specifically, the moth-eye transfer mold 1 including the base 10, the underlayer 20 formed on the base 10, and the glassy carbon layer 30 formed on the underlayer 20, the glassy carbon layer 30 having the inverted moth-eye structure RM over the surface 30a, is prepared. The inverted moth-eye structure RM is formed by randomly arranged conical pores. The glassy carbon microstructure constituting the inverted moth-eye structure RM has an average diameter (D) of 10 nm to 400 nm, preferably 30 nm to 300 nm, and particularly preferably 50 nm to 150 nm, and an average height (H) of 30 nm to 1,000 nm, preferably 50 nm to 700 nm, and particularly preferably 100 nm to 500 nm, and an average pitch (P) of 10 nm to 500 nm, preferably 30 nm to 400 nm, and particularly preferably 50 nm to 300 nm.

(Step of Preparation Work)

In the step of preparing a work (step S12), a work 100 (an article 100) to be processed is prepared. In advance, a pretreatment for improving the deposition performance (lamination performance) of the photocurable resin may be performed, such as washing a work surface 100a of the work 100 or performing a charging treatment.

(Step of Curing Photocurable Resin)

In the step (step S13) of curing the photocurable resin, a photocurable resin is irradiated with light, with the photocurable resin interposed between the moth-eye transfer mold and the surface of the work, thereby curing the photocurable resin.

When the shape of the moth-eye transfer mold 1 is a roll shape, by spinning the roll-shaped moth-eye transfer mold 1 around its axis, the inverted moth-eye structure RM that is a surface structure of the moth-eye transfer mold 1 can continuously transferred to the work 100. When a roll-shaped film is used as an object, a roll-to-roll method can be adopted.

In addition, when a flexible material is used as the base 10 of the moth-eye transfer mold 1, by a combination of decompression and pressurization, with the flexible moth-eye transfer mold 1 brought into close contact with the work 100, the photocurable resin can be irradiated with light, thereby curing the photocurable resin. By using the flexible moth-eye transfer mold 1, it is possible to transfer the moth-eye structure even to the irregular-shaped work 100.

The photocurable resin is not particularly limited as long as it can be cured with light such as ultraviolet light, and acrylic resin, epoxy resin, urethane resin, etc. can be used.

(Step of Peeling Off Moth-Eye Transfer Mold)

In the step (step S14) of peeling off the moth-eye transfer mold, the moth-eye transfer mold is peeled off from the surface microstructure which is formed by the cured photocurable resin.

<Article with Surface Microstructure>

Figure 4:
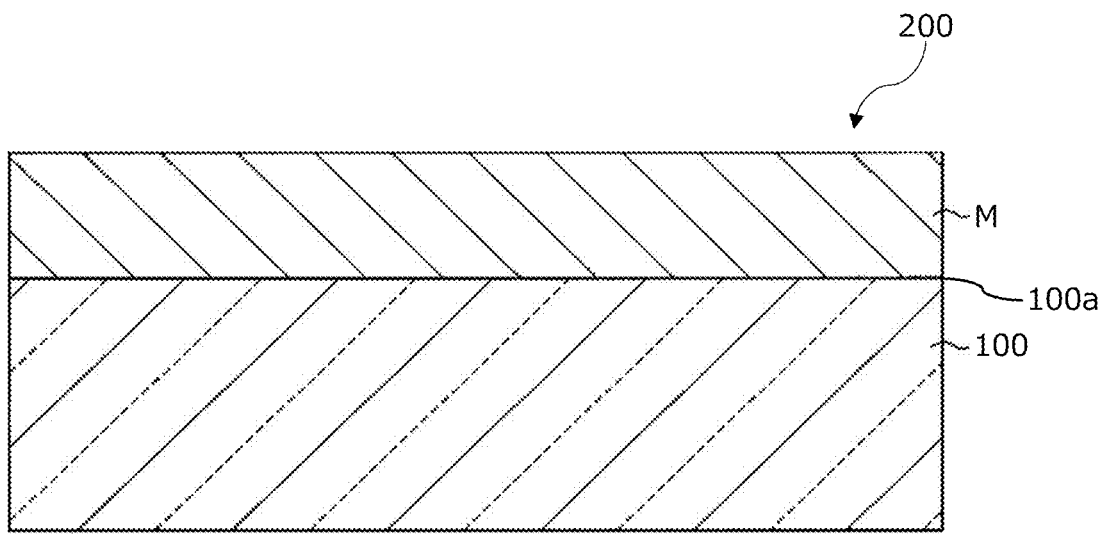
FIG. 4 is a schematic cross-sectional view showing an article provided with a surface microstructure according to an embodiment of the present invention.

An article 200 provided with a surface microstructure according to the present embodiment, as shown in FIG. 4, includes an article 100 that is an object, and a surface microstructure M formed on the article 100, and the surface microstructure M is formed by randomly arranged minute protrusions having a needle shape or a cone shape whose diameter decreases from the root toward the tip and whose tip is sharpened.

(Work 100)

In a method of forming a surface microstructure according to the present embodiment, the work 100 (the article 100) on which the surface microstructure is to be formed is an article with which functionality such as antifouling properties, antifogging properties, and low reflectivity is to be provided, and is not particularly limited.

Specific examples of the work 100 to be processed include, but not limited to, various display devices such as smartphones, tablet devices, liquid crystal displays, organic EL displays, various computers, televisions, and plasma display panels, and touch panels and displays therefor, lenses and window members (protective glass) for outdoor monitoring cameras (security cameras), human sensors, etc., window glass and mirrors for vehicles such as automobiles, trains and aircrafts, window glass for buildings such as houses, lenses and window members (protective glass) for vehicle cameras, antireflection sheets (antireflection films), antifouling sheets (antifouling films), antifogging sheets (antifogging films), polarizing plates for use in liquid crystal display devices, optical members such as eyeglass lenses, sunglasses lenses, camera viewfinder lens, prism, fly-eye lens, and toric lens which are made of transparent plastics, various optical lenses for imaging optical systems including these optical members, observation optical systems such as binoculars, projection optical systems for use in projection devices such as liquid crystal projectors, scanning optical systems for use in laser beam printers, etc., optical members such as instrument covers, solar cell panels (protective cover glass for solar cells), digital signage, and showcases.

The work 100 has the work surface 100a, and the shape of the work surface 100a is not limited to a flat surface (a flat plate shape), and may be a curved shape (for example, a roll shape) such as a curved surface, a complicated shape (an irregular shape) formed by a combination of a flat surface and a curved surface, and an inner surface of a hollow member.

In the method of forming the surface microstructure according to the present embodiment, a step of performing processing at a high temperature is not required, and therefore, the method can be suitably applied to the work 100 containing a heat-sensitive substance (material) such as resin.

The resin in the work may be either a thermoplastic resin or a thermosetting resin, and examples of the resin include polyolefins such as polyethylene (high density, medium density or low density), polypropylene (isotactic type or syndiotactic type), polybutene, ethylene-propylene copolymer, ethylene-vinyl acetate copolymer (EVA), and ethylene-propylene-butene copolymer, cyclic polyolefin, modified polyolefin, polyvinyl chloride, polyvinylidene chloride, polystyrene, polyamide, polyimide, polyamideimide, polycarbonate, poly-(4-methylpentene-1), ionomer, acrylic resin, polymethyl methacrylate, polybutyl (meth)acrylate, methyl (meth)acrylate-butyl (meth)acrylate copolymer, methyl (meth)acrylate-styrene copolymer, acrylic-styrene copolymer (AS resin), butadiene-styrene copolymer, ethylene-vinylalcohol copolymer (EVOH), polyesters such as polyethylene terephthalate (PET), polybutylene terephthalate (PBT), ethylene terephthalate-isophthalate copolymer, polyethylene naphthalate, and polycyclohexylenedimethylene terephthalate (PCT), polyether, polyetherketone (PEK), polyetheretherketone (PEEK), polyetherimide, polyacetal (POM), polyphenylene oxide, modified polyphenylene oxide, polyarylate, aromatic polyester (liquid crystal polymer), polytetrafluoroethylene (PTFE), polyvinylidene fluoride, other fluorine-based resins, various thermoplastic elastomers such as styrene, polyolefin, polyvinyl chloride, polyurethane, fluororubber, and chlorinated polyethylene, epoxy resins, phenol resins, urea resins, melamine resins, unsaturated polyester, silicone resins, polyurethane, nylon, cellulose resin such as nitrocellulose, cellulose acetate, and cellulose acetate propionate, and copolymers, blends, polymer alloys, etc. composed mainly of these, and one or more of these may be used in combination (for example, laminates of two or more layers).

Examples of glass in the work include silicate glass (quartz glass), alkali silicate glass, soda lime glass, potash lime glass, lead (alkali) glass, barium glass, and borosilicate glass.

Examples of metal in the work include gold, chromium, silver, copper, platinum, indium, palladium, iron, titanium, nickel, manganese, zinc, tin, tungsten, tantalum, and aluminum.

In addition, stainless steels such as SUS316L, shape memory alloys such as Ti—Ni alloys and Cu—Al—Mn alloys, Cu—Zn alloys, Ni—Al alloys, titanium alloys, tantalum alloys, platinum alloys, or tungsten alloys, which are alloys of the above-described metal, can be used.

An alloy is obtained by adding one or more metal elements or non-metal elements to the above metal element. The structure of the alloy includes a eutectic alloy in which component elements become separate crystals, a solid solution in which component elements are completely soluble in one another, and one in which component elements consists an intermetallic compound or a compound of metal and non-metal, but not necessarily limited to this.

Examples of ceramics in the work include oxides (for example, aluminum oxide, zinc oxide, titanium oxide, silicon oxide, zirconia, and barium titanate), nitrides (for example, silicon nitride and boron nitride), carbide (for example, silicon carbide), and oxynitrides. A mixture thereof can also be used.

Examples of metal oxides in the work include, but not necessarily limited to, oxides containing aluminum, copper, gold, silver, platinum, indium, palladium, iron, nickel, titanium, chromium, manganese, zinc, tin, tungsten, etc. as metal, indium tin oxide (ITO), aluminum oxide ($Al_2O_3$), titanium oxide ($TiO_2$), silicon oxide ($SiO_2$), tin oxide ($SnO_2$, SnO), iron oxide ($Fe_2O_3$, $Fe_3O_4$), and composite oxide having a perovskite structure, a spinel structure, or an ilmenite structure.

Examples of metal nitrides in the work include, but not necessarily limited to, titanium nitride (TiN), zirconium nitride (ZrN), vanadium nitride (VN), niobium nitride (NbN), tantalum nitride (TaN), chromium nitride (CrN, $Cr_2N$), and hafnium nitride (HfN).

Examples of other materials in the work include a silicon wafer, a compound semiconductor for use in a compound semiconductor substrate, silicon carbide (SiC) for use in a substrate for a power device, and a solar cell material such as silicon, but not necessarily limited to these materials.

(Surface Microstructure M)

The surface microstructure M (a moth-eye structure M) is a microstructure laminated over the work surface 100a of the work 100 (the article 100). The surface microstructure M is formed by a method of transferring a moth-eye structure with the use of the moth-eye transfer mold 1 according to the present embodiment.

The surface microstructure M is formed by the cured photocurable resin, and is formed by randomly arranged minute protrusions having a needle shape or cone shape whose diameter decreases from the root toward the tip and whose tip is sharpened. The protrusions constituting the surface microstructure M have an average diameter (D) of 10 nm to 400 nm, preferably 30 nm to 300 nm, and particularly preferably 50 nm to 150 nm, an average height (H) of 30 nm to 1,000 nm, preferably 50 nm to 700 nm, and particularly preferably 100 nm to 500 nm, and an average pitch (P) of 10 nm to 500 nm, preferably 30 nm to 400 nm, and particularly preferably 50 nm to 300 nm.

The thickness of the surface microstructure M may be appropriately selected according to the shape and use of the work 100, and is preferably not less than several nm and not more than several µm, more preferably not less than several nm and not more than 30 µm, more preferably not less than several nm and not more than 10 µm, still more preferably not less than 10 nm and not more than 5.0 µm, and still more preferably not less than 10 nm and not more than 1.0 µm. It is not preferable that the thickness of the surface microstructure M is too thin from the viewpoint of durability. On the other hand, it may not be preferable that the thickness of the surface microstructure M is too thick, depending on the use of the work 100, from the viewpoints of a decrease in transmittance, a decrease in flexibility, a reduction in weight, a cost, etc.

The article 200 provided with the surface microstructure, on which the surface microstructure M is laminated, has the reduced surface reflectance, and the reflectance of the surface at a wavelength of 300 nm to 1,000 nm is 15% or less, preferably 10% or less, more preferably 6% or less, still more preferably 4% or less, and particularly preferably 2% or less. Since the value of the reflectance of the surface is within the above range, the reflection of the surface of the work 100 can be suppressed.

The article 200 provided with the surface microstructure, on which the surface microstructure M is laminated, has the improved surface water repellency, and a water contact angle of the surface is 120° or more, preferably 130° or more, and more preferably 140° or more. Since the water contact angle on the surface of the surface microstructure M is within the above range, the surface has high water repellency, whereby adhered dirt and foreign matters can be easily removed by washing with water, and fogging due to water droplet adhesion can be prevented.

In the present embodiment, the moth-eye transfer mold, the method of manufacturing a moth-eye transfer mold, the method of transferring a moth-eye structure, and the article provided with the surface microstructure according to the present invention have been mainly described.

However, the above embodiment is merely an example for facilitating understanding of the present invention, and does not limit the present invention. The present invention can be changed and improved without departing from the scope thereof, and the present invention includes the equivalents thereof.

EXAMPLES

Hereinafter, specific examples of the moth-eye transfer mold, the method of manufacturing a moth-eye transfer mold, the method of transferring a moth-eye structure, and the article provided with a surface microstructure according to the present invention will be described, but the present invention is not limited thereto.

<Test 1 Manufacture of Moth-Eye Transfer Mold>

Hereinafter, a glass base was used as the base, and the type of the underlayer, deposition conditions for the glassy carbon layer, and etching conditions for the glassy carbon layer were examined.

(1. Base Preparation Step)

As the base, a glass base (100 mm×100 mm in size, 0.7 mm in thickness) was prepared and washed with pure water.

(2. Underlayer Forming Step)

The underlayer was formed on the glass base under the following conditions.
Sputtering system: Carousel type of batch sputtering system
Target: 5"×25", 6 mm in thickness Ti target
Sputtering method: RF sputtering
Exhaust device: Turbomolecular pump
Ultimate vacuum: $5\times10^{-4}$ Pa
Base temperature: 25° C. (Room temperature)
Sputtering power: 1 kW
Underlayer thickness: 100±10 nm
Ar flow rate: 500 sccm (3. Glassy Carbon Layer Deposition Step)

The glassy carbon layer was formed on the underlayer under the following conditions.

Sputtering system: Carousel type of batch sputtering system
Target: 5 " × 25 " , 6 mm in thickness    Glassy carbon (GC) target
Sputtering method: DC sputtering
Exhaust device: Turbomolecular pump
Ultimate vacuum: $6 \times 10^{-4}$ Pa
Base temperature: 25° C. (Room temperature)
Sputtering power: Example 1 1 kW
                  Example 2 2 kW
Deposition pressure: Example 1 $8 \times 10^{-1}$ Pa
                     Example 2 $5 \times 10^{-1}$ Pa
Film thickness of glassy carbon layer: 1.75 ± 0.25 µm
Ar flow rate: 500 sccm (4. Etching Step)

In the etching step, the glassy carbon layer was dry-etched with oxygen plasma.

Specifically, each sample was set in a holder of an ICP plasma processor (Elionix INC, trade name: EIS-700). In the case of plasma, by adjusting the high frequency power output and the bias power output, acceleration voltage is applied to oxygen ions. These power outputs were adjusted to perform processing. Furthermore, the etching conditions are as follows.
Sample stage size: Φ6 inch wafer
High frequency power: 500 W
Bias power: 50 W
Vacuum: $1.3\times10^{-2}$ Pa
Reactive gas: Oxygen
Gas flow rate: 50 SCCM
Processing time: 280 seconds (250 seconds+30 seconds)

As a result of Test 1, it was found that when the underlayer of Ti was provided on the glass base, the glassy carbon layer was properly deposited without being peeled off. Similarly, when the underlayer of Cr was used, the glassy carbon layer was properly deposited without being peeled off.

Furthermore, it was found that when the underlayer of Ti or Cr was provided on a metal base, and the underlayer of Ti, Cr, Ti/Ta$_2$O$_5$, Cr/Ta$_2$O$_5$, etc was provided on a plastic base such as a plastic film base, the glassy carbon layer was properly deposited without being peeled off.

<Test 2 Evaluation of Moth-Eye Transfer Mold>

The moth-eye transfer molds according to Example 1 and Example 2 which were manufactured in Test 1 were evaluated.

Specifically, for each sample, observation of a surface state and measurement of reflectance were performed.

(1. Observation of Surface State)

The surface states of each sample before and after the etching step were observed with a field emission scanning electron microscope (FE-SEM, manufactured by Hitachi High-Technologies Corporation, S-4300).

Figure 5:
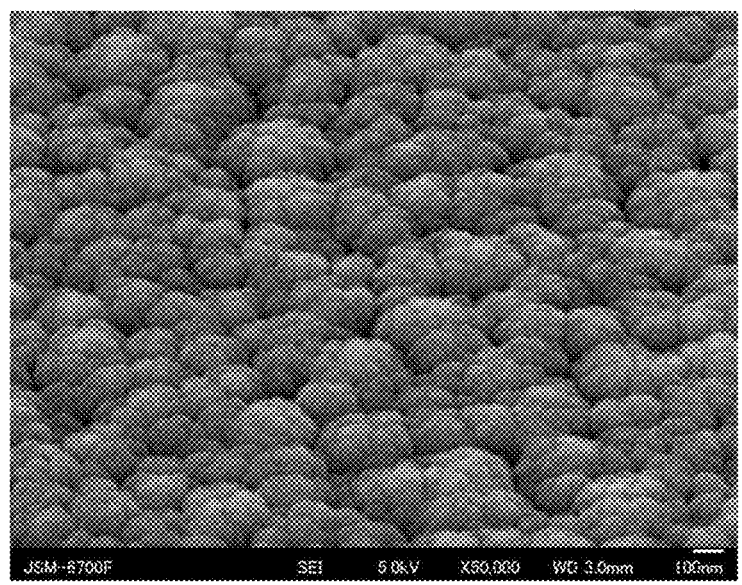
FIG. 5 shows electron micrographs representing surface states of a moth-eye transfer mold of a sample according to Example 1 before and after an etching step.
Figure 5:
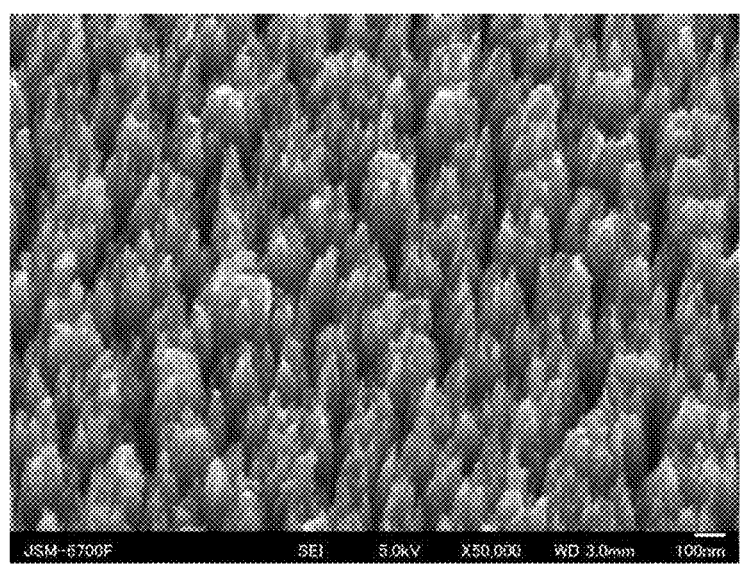
Figure 6:
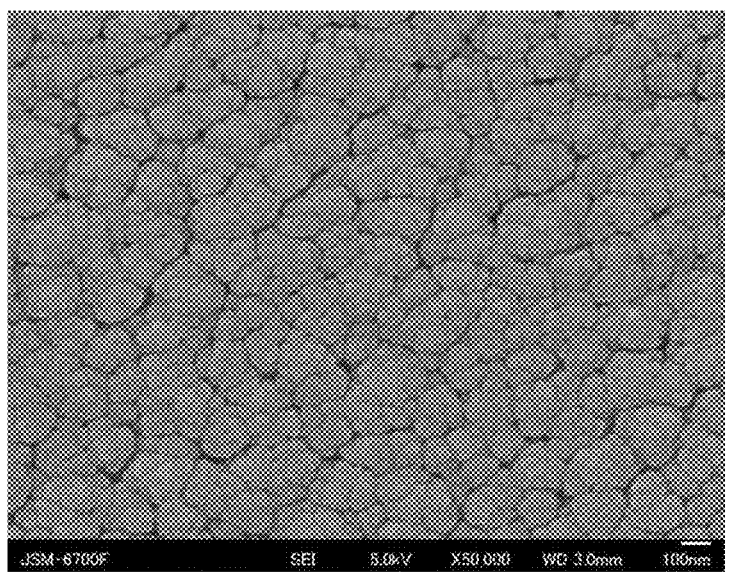
FIG. 6 shows electron micrographs representing surface states of a moth-eye transfer mold of a sample according to Example 2 before an etching step.
Figure 6:
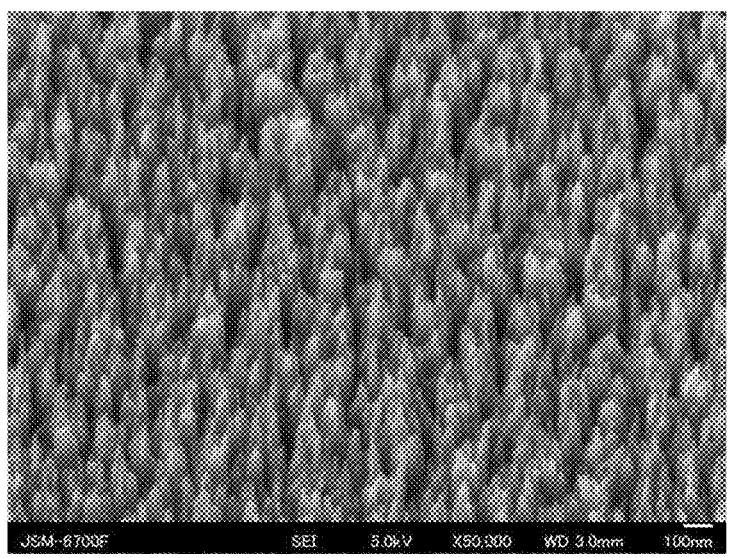

The results are shown in FIGS. 5 and 6.

FIG. 5 shows electron micrographs representing surface states of a moth-eye transfer mold of a sample according to Example 1 before and after the etching step, and FIG. 6 shows electron micrographs representing surface states of a moth-eye transfer mold of a sample according to Example 2 before the etching step.

As shown in the lower figure of FIG. 5 and the lower figure of FIG. 6, conical pores having a diameter of less than 100 nm, a pitch of 100 nm, and a depth of 200 nm or more were uniformly formed in a random arrangement on the surface of the moth-eye transfer mold after the etching step, and the surface had an inverted shape of an ideal moth-eye structure. The sample according to Example 2 had the more uniform and minuter glass carbon microstructure than the sample according to Example 1. Thus, it was found that the sputtering power in the glassy carbon layer deposition step was preferably as large as 2 kW or more, and the deposition pressure was preferably as low as $5 \times 10^{-1}$ Pa or less.

<Test 3 Transfer of Moth-Eye Structure>

The moth-eye structures were transferred using the moth-eye transfer molds according to Example 1 and Example 2 which were manufactured in Test 1.

A fluorine mold releasing agent (manufactured by DAIKIN INDUSTRIES, LTD, product name: UD-509) was applied to the moth-eye transfer molds according to Example 1 and Example 2 to undergo mold release treatment.

As the work, a triacetylcellulose film (TAC film) was used.

Next, a ultraviolet curing resin (acrylic resin, manufactured by Origin Electric Co., Ltd., product name: UV coating TP) was applied to the surface of each moth-eye transfer mold, with which the TAC film serving as the work was brought into close contact, and was irradiated with ultraviolet light (metal halide lamp light source, a wavelength of 200 nm to 450 nm, an intensity of 600 mJ, and an irradiation time of 40 seconds) to be cured.

Then, the moth-eye transfer mold was peeled off from the surface microstructure formed by the cured photocurable resin to obtain the TAC film provided with the moth-eye structure (surface microstructure).

<Test 4 Evaluation of Moth-Eye Structure>

The moth-eye structures according to Example 1 and Example 2 which were transferred in Test 3 were evaluated.

Specifically, the transferred moth-eye structures were subjected to surface state observation, spectroscopic measurement, contact angle evaluation, sliding test, and haze (haze value) measurement.

(1. Observation of Surface State)

The surface states of the transferred moth-eye structures were observed with the field emission scanning electron microscope (FE-SEM, manufactured by Hitachi High-Technologies Corporation, S-4300).

Figure 7:
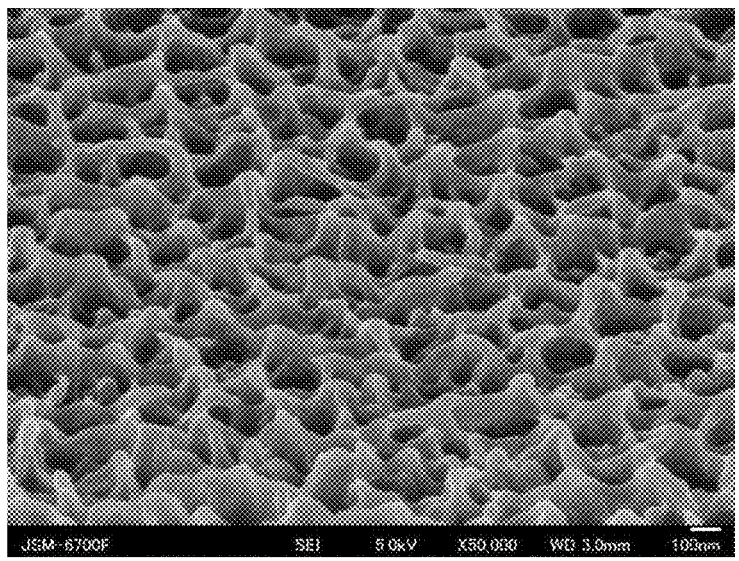
FIG. 7 is an electron micrograph showing a moth-eye structure transferred using the moth-eye transfer mold of the sample according to Example 1.
Figure 8:
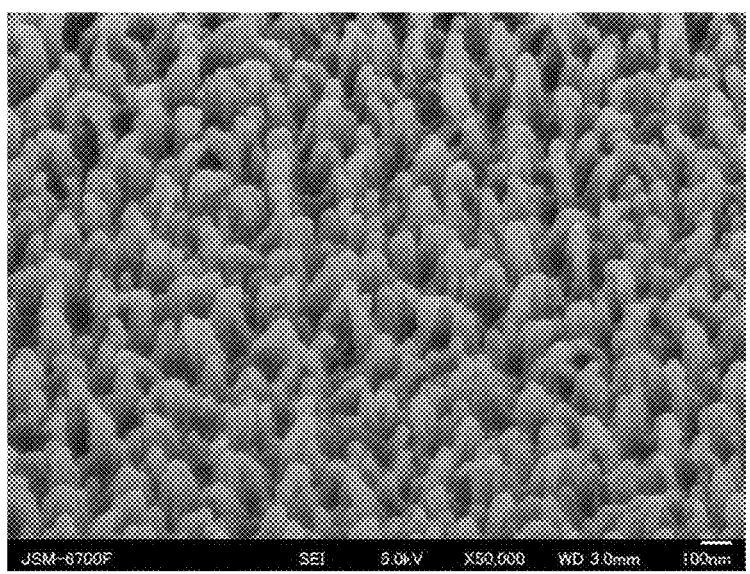
FIG. 8 is an electron micrograph showing the moth-eye structure transferred using the moth-eye transfer mold of the sample according to Example 2.

The results are shown in FIGS. 7 and 8.

FIG. 7 is an electron micrograph showing a moth-eye structure transferred using the moth-eye transfer mold of the sample according to Example 1, and FIG. 8 is an electron micrograph showing a moth-eye structure transferred using the moth-eye transfer mold of the sample according to Example 2.

As shown in FIG. 7 and FIG. 8, the moth-eye structure formed by randomly arranged minute protrusions having a needle shape or cone shape whose diameter decreased from the root toward the tip and whose tip was sharpened, was successfully formed over the surface of the TAC film. The minute protrusions corresponded to the inverted moth-eye structure formed over the surface of the moth-eye transfer mold, and had a diameter of less than 100 nm, a pitch of 100 nm, and a height of 200 nm or more.

(2. Spectroscopic Measurement)

The transmittance and reflectance of each sample were measured in a wavelength region of 300 nm to 1,000 nm with a spectrophotometer (manufactured by Hitachi High-Technologies Corporation, U-4100).

The results of spectroscopic measurement are shown in FIGS. 9 to 12.

Figure 9:
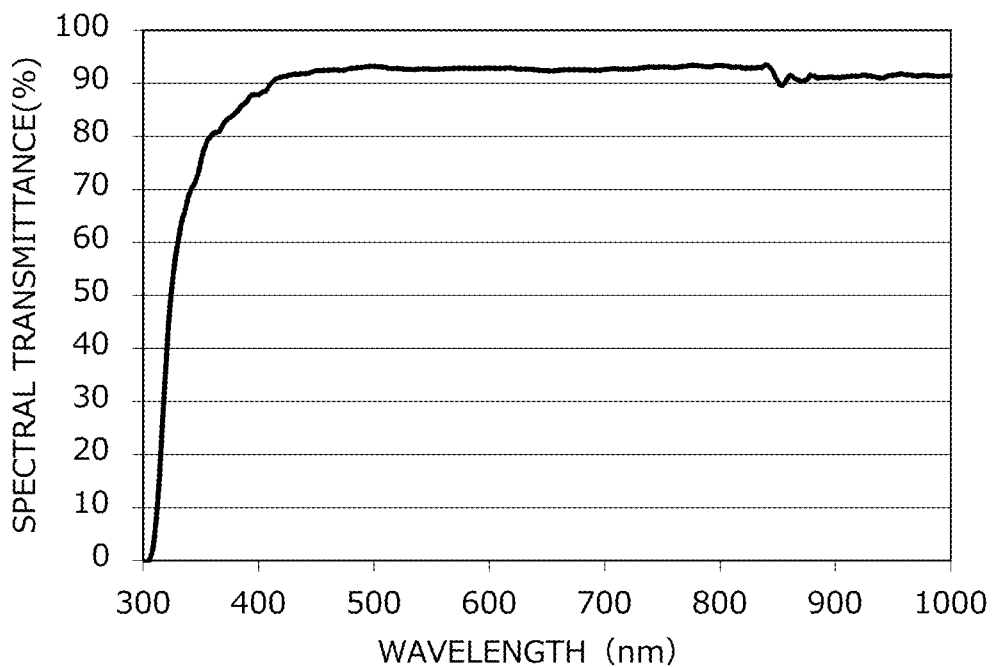
FIG. 9 is a graph showing transmittance of the moth-eye structure transferred using the moth-eye transfer mold of the sample according to Example 1.
Figure 10:
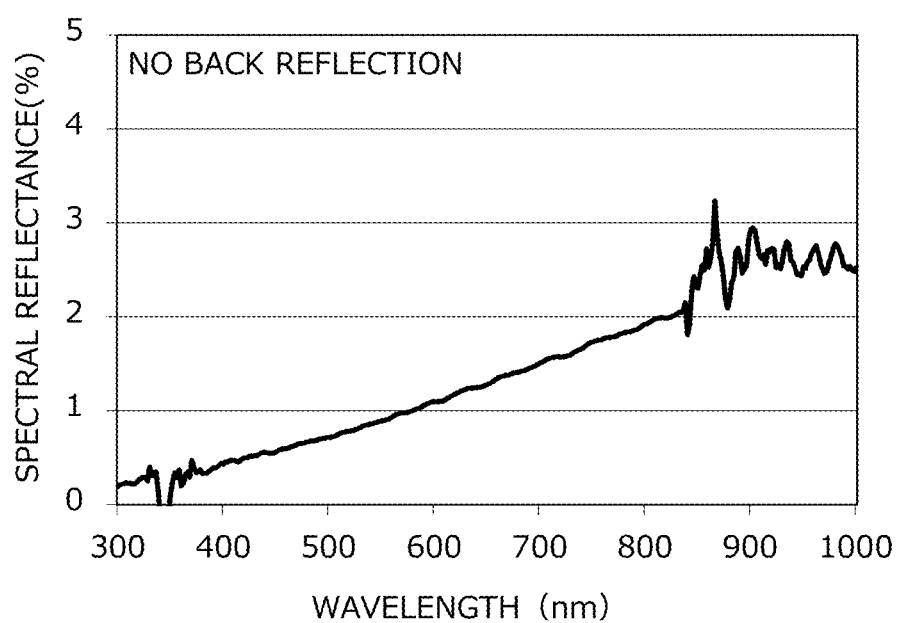
FIG. 10 is a graph showing reflectance of the moth-eye structure transferred using the moth-eye transfer mold of the sample according to Example 1.

FIG. 9 is a graph showing transmittance of the moth-eye structure transferred using the moth-eye transfer mold of the sample according to Example 1, and FIG. 10 is a graph showing reflectance of the moth-eye structure transferred using the moth-eye transfer mold of the sample according to Example 1.

Figure 11:
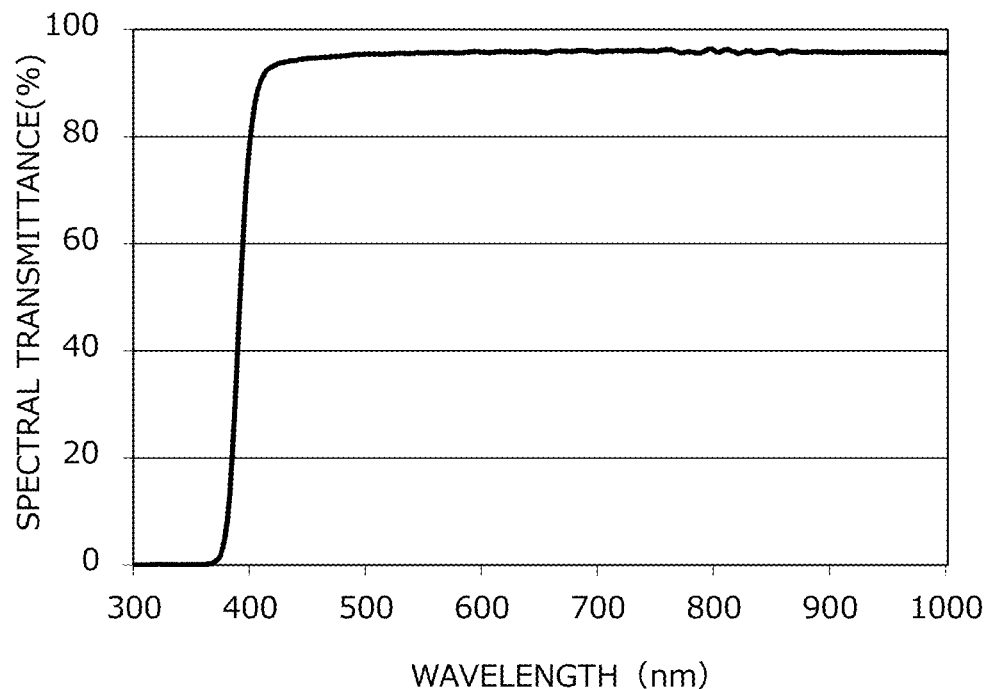
FIG. 11 is a graph showing transmittance of the moth-eye structure transferred using the moth-eye transfer mold of the sample according to Example 2.
Figure 12:
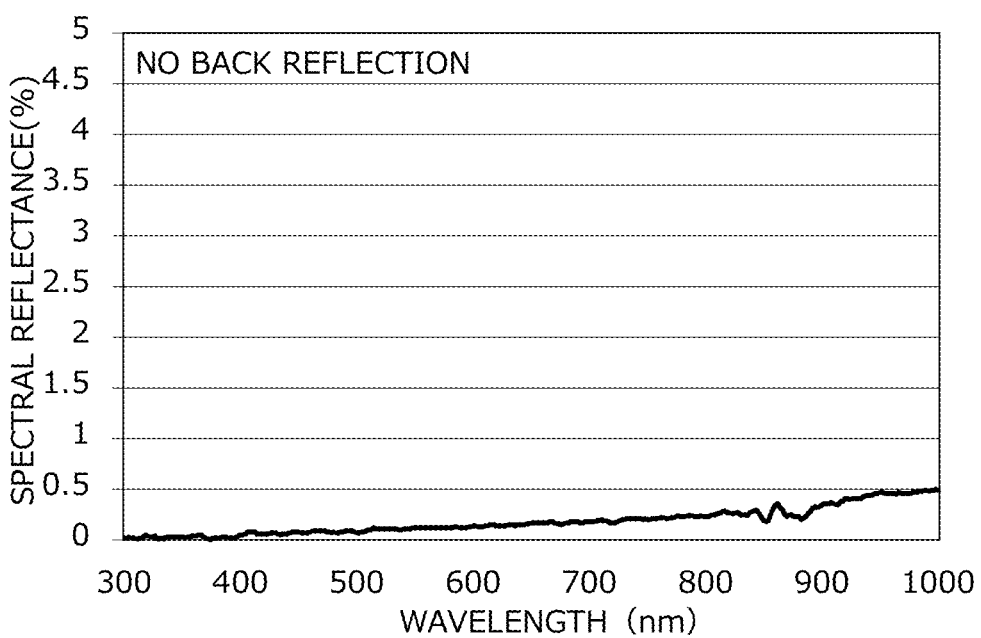
FIG. 12 is a graph showing reflectance of the moth-eye structure transferred using the moth-eye transfer mold of the sample according to Example 2.
Figure 13:
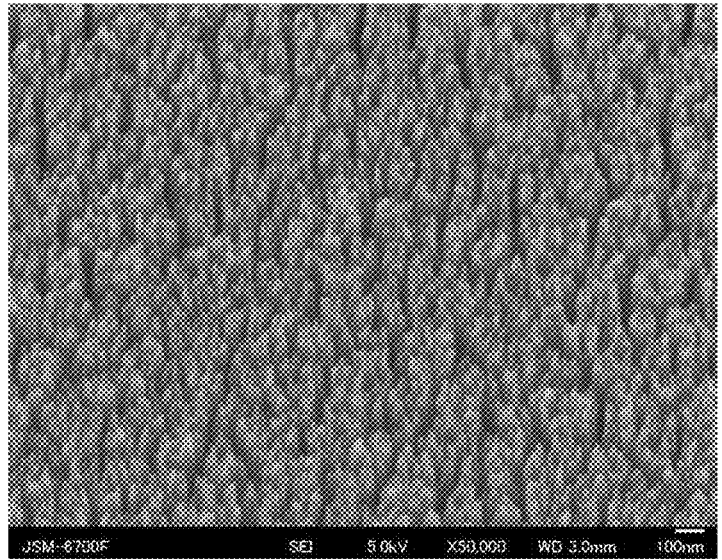
FIG. 13 shows electron micrographs representing a surface state of a moth-eye transfer mold of a sample according to Example 3 after an etching step.
Figure 13:
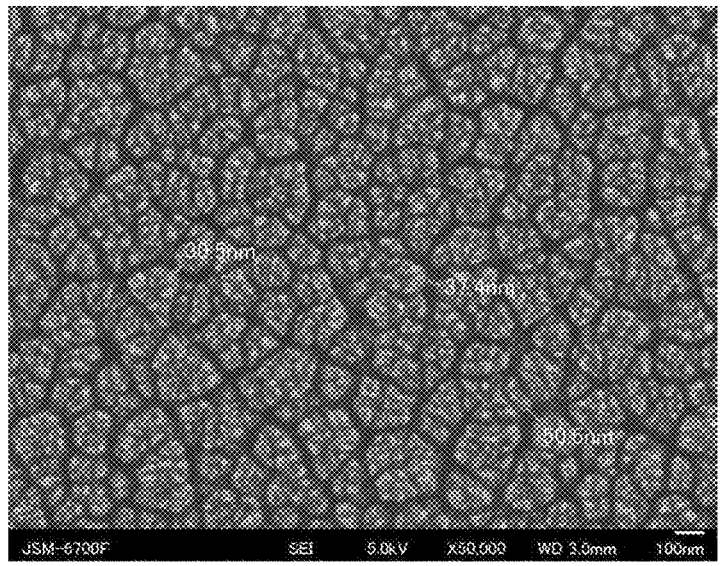
Figure 13:
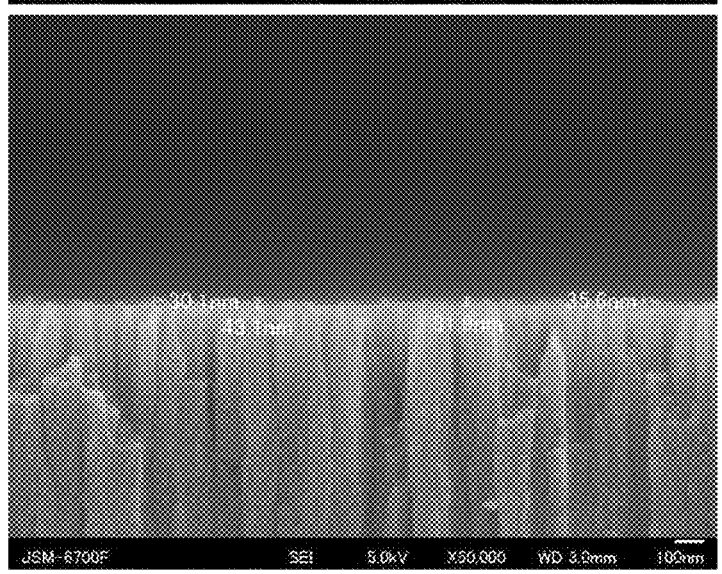
Figure 14:
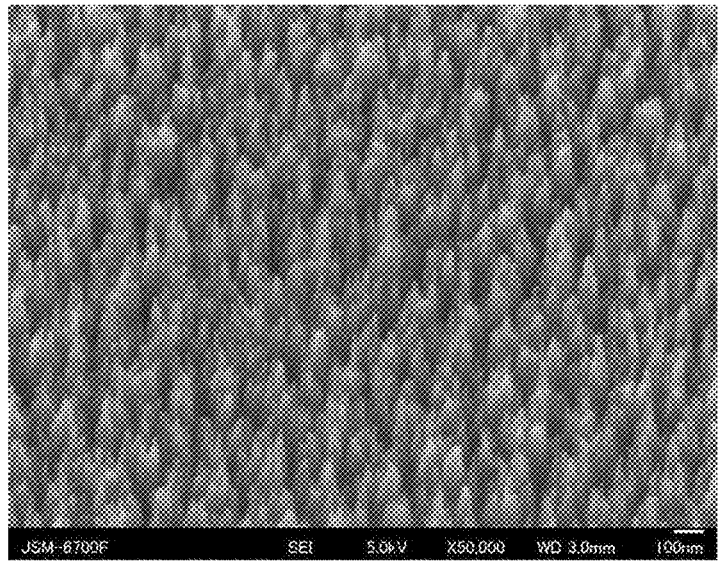
FIG. 14 shows electron micrographs representing a surface state of a moth-eye transfer mold of a sample according to Example 4 after an etching step.
Figure 14:
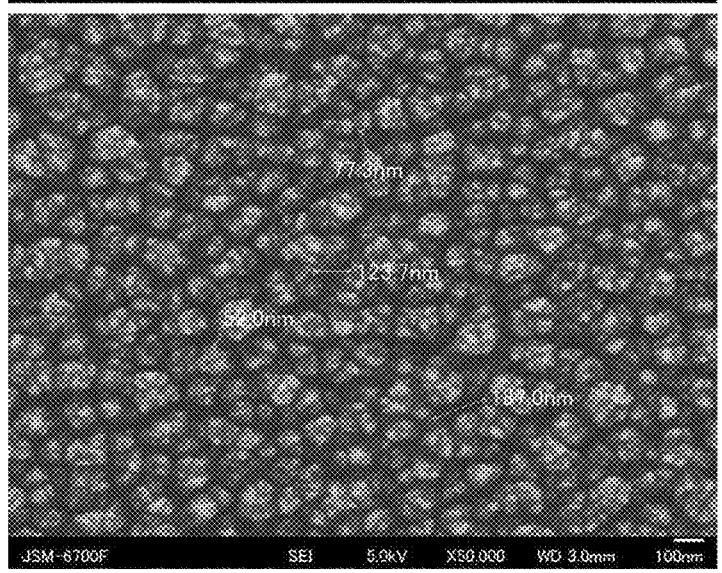
Figure 14:
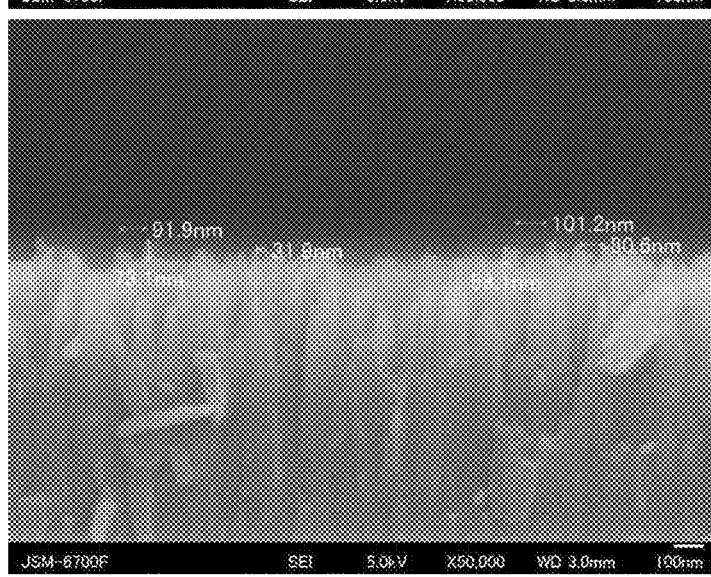
Figure 15:
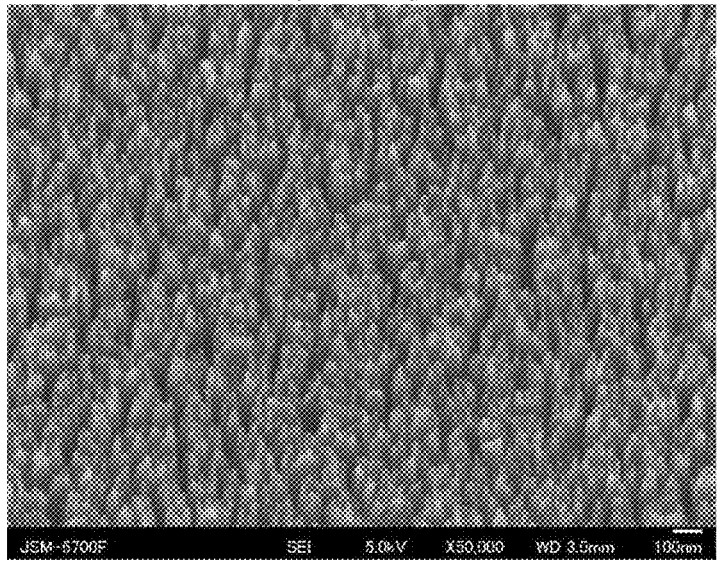
FIG. 15 shows electron micrographs representing a surface state of a moth-eye transfer mold of a sample according to Example 5 after an etching step.
Figure 15:
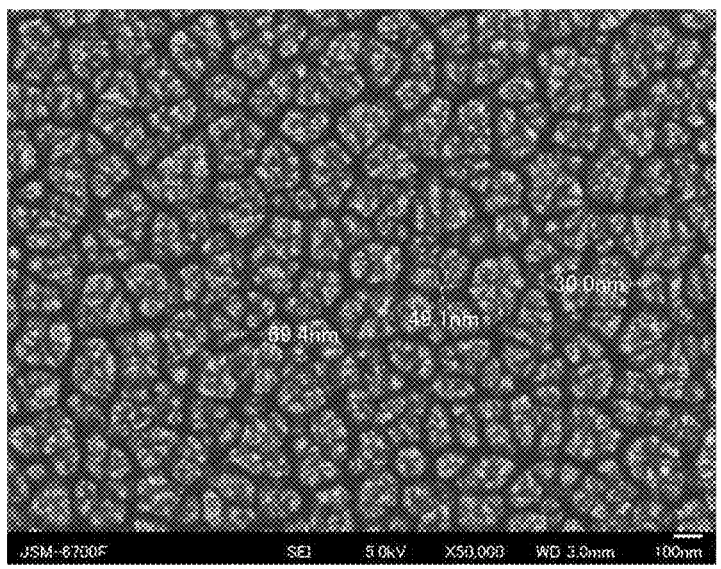
Figure 15:
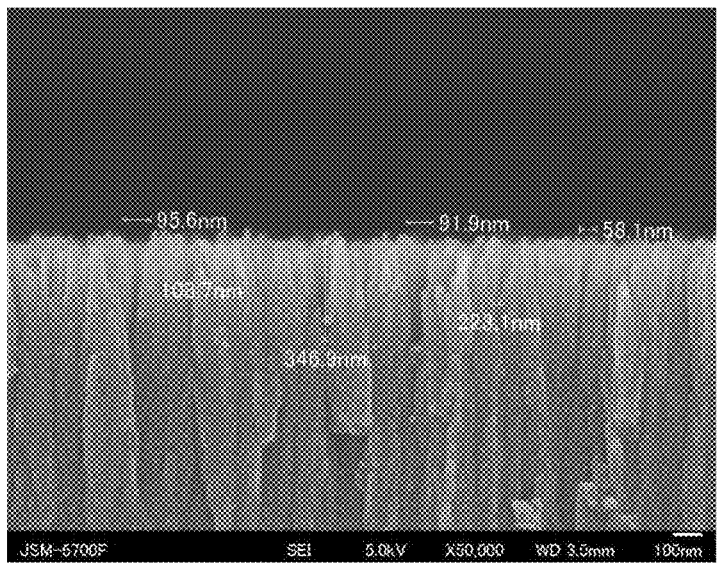
Figure 16:
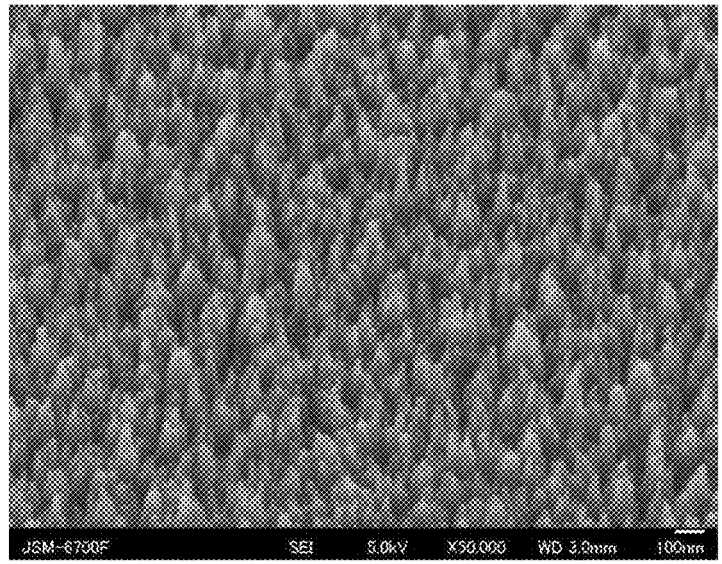
FIG. 16 shows electron micrographs representing a surface state of a moth-eye transfer mold of a sample according to Example 6 after an etching step.
Figure 16:
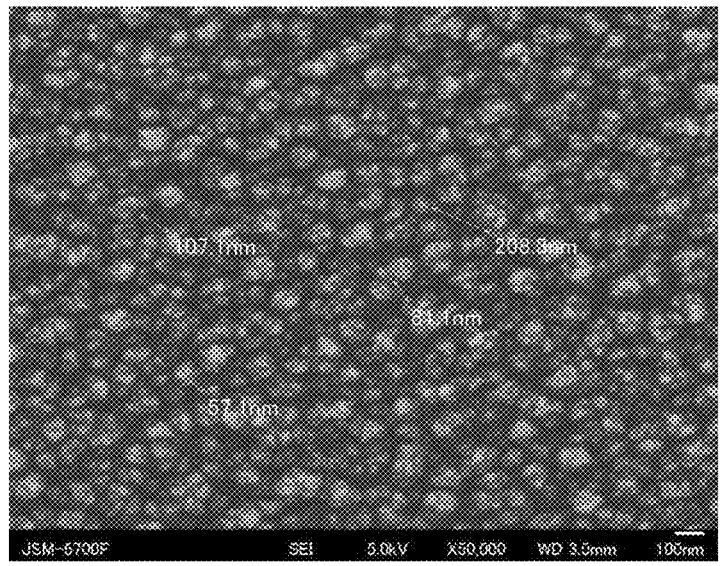
Figure 16:
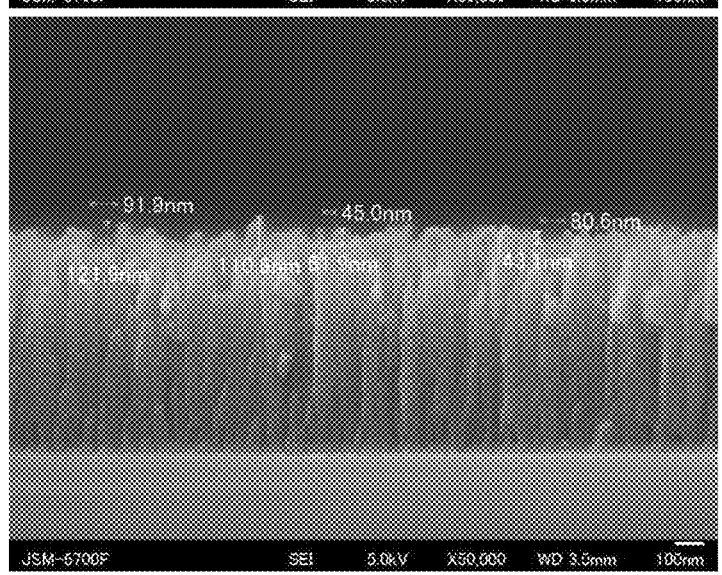
Figure 17:
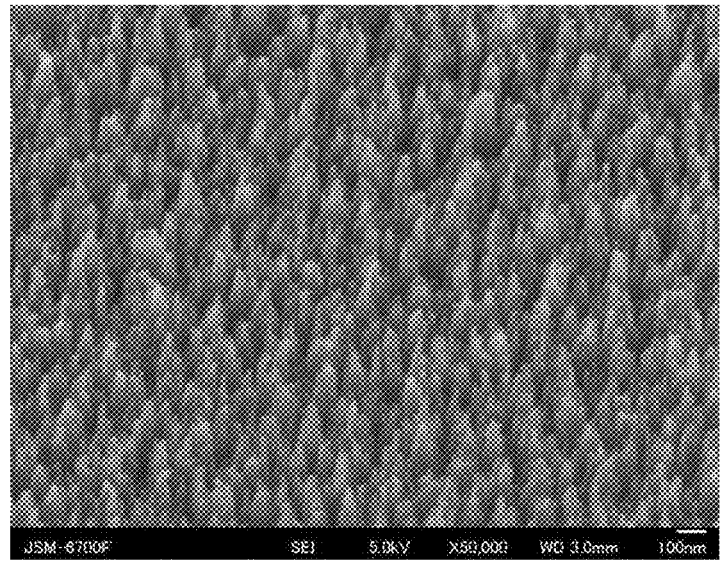
FIG. 17 shows electron micrographs representing a surface state of a moth-eye transfer mold of a sample according to Example 7 after an etching step.
Figure 17:
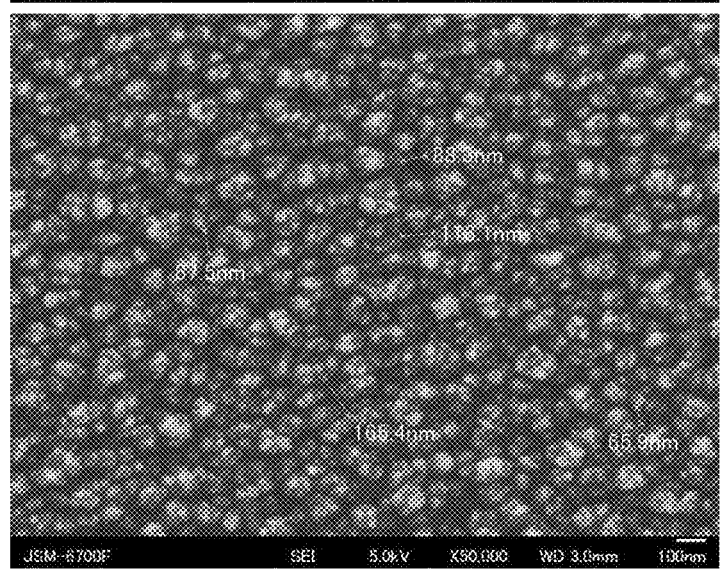
Figure 17:
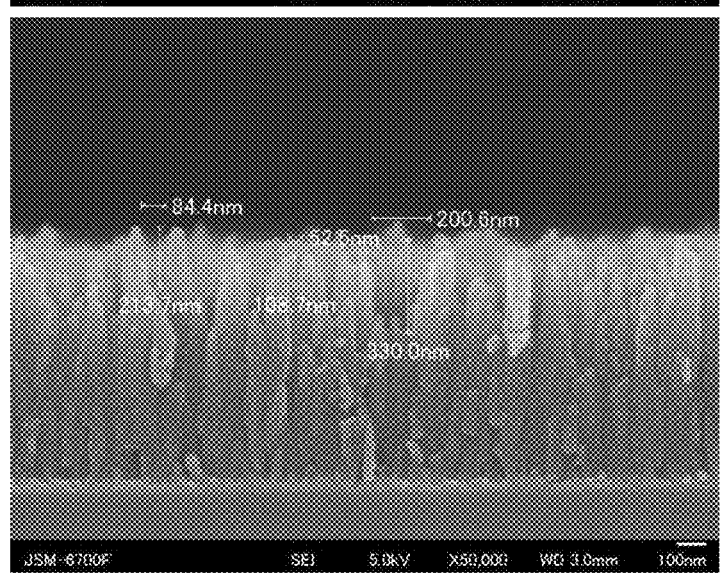

FIG. 11 is a graph showing transmittance of the moth-eye structure transferred using the moth-eye transfer mold of the sample according to Example 2, and FIG. 12 is a graph showing reflectance of the moth-eye structure transferred using the moth-eye transfer mold of the sample according to Example 2.

As a result of the spectroscopic measurement, the Y value (luminous reflectance) was 0.2% or less.

Furthermore, as shown in FIG. 10, in the sample according to Example 1, the reflectance was 3% or less at 300 nm to 1,000 nm. As shown in FIG. 12, in the sample according to Example 2, the reflectance was 0.5% or less at 300 nm to 1,000 nm.

Example 1 and Example 2 are different in sputtering power and deposition pressure in the glassy carbon layer deposition step, thus it was found that preferably the sputtering power is 2 kW or more and the deposition pressure is $5 \times 10^{-1}$ Pa or less.

(3. Contact Angle Measurement)

The contact angle on the surface of the transferred moth-eye structure was measured at 25° C. with a contact angle meter (manufactured by Kyowa Interface Science Co., Ltd., model number CA-X).

The contact angle on the surface of the moth-eye structure according to Example 1 was 155.8°, and the contact angle on the surface of the moth-eye structure according to Example 2 was 142.8°.

(4. Sliding Test)

The sliding test was performed by sliding 4.9 N load cloth 10,000 times with Both-Way Wear Tester (manufactured by Shinto Scientific Co., Ltd., model number TYPE: 30/30S).

The contact angle on the sample after the test was measured at 25° C. with the contact angle meter (manufactured by Kyowa Interface Science Co., Ltd., model number CA-X).

The contact angle on the surface of the moth-eye structure according to Example 1 after the sliding test was 140°, and the contact angle was maintained high.

(5. Haze (Haze Value) Measurement)

The haze (haze value) was measured at 25° C. with a haze meter (manufactured by Suga Test Instruments Co., Ltd., model number HGM-2DP).

The haze value was 0.3% (Example 2).

<Test 5 Examination of Plasma Irradiation Time (Processing Time) in Etching Step>

The base preparation step, the underlayer forming step, and the glassy carbon layer deposition step were performed under the same conditions as in Example 2. Then, the etching step was performed by setting the processing time for dry-etching the glassy carbon layer with oxygen plasma to 80 seconds to 170 seconds (Example 3 to Example 7).

Specifically, each sample was set in the holder of the ICP plasma processor (Elionix INC, trade name: EIS-700), and the etching was performed under the following etching conditions.
Sample stage size: Φ6 inch wafer
High frequency power: 500 W
Bias power: 50 W
Vacuum: $1.3 \times 10^{-2}$ Pa
Reactive gas: Oxygen
Gas flow rate: 50 SCCM
Processing time: Example 3: 80 seconds
　　Example 4: 100 seconds
　　Example 5: 150 seconds
　　Example 6: 160 seconds
　　Example 7: 170 seconds The surface states of the moth-eye transfer molds according to Example 3 to Example 7 were observed. Electron micrographs are shown in FIG. 13 to FIG. 17. Table 2 shows the results of measuring an average height, average diameter, and average pitch of the glassy carbon microstructures for Example 3, Example 5, and Example 7.

TABLE 2

| | Processing time | Average height (H) | Average diameter (D) | Average pitch (P) |
|---|---|---|---|---|
| Example 3 | 80 seconds | 105.5 nm to 141.7 nm | 59.6 nm to 279.6 nm | 78.7 nm to 286.1 nm |
| Example 5 | 150 seconds | 108.7 nm to 346.9 nm | 148.1 nm to 277.7 nm | 117.6 nm to 222.2 nm |
| Example 7 | 170 seconds | 108.7 nm to 496.3 nm | 46.3 nm to 106.5 nm | 50.9 nm to 196.3 nm |

As shown in the above results, over the surface of the moth-eye transfer mold, the inverted moth-eye structure was formed by randomly arranged conical pores. The glassy carbon microstructure constituting the inverted moth-eye structure has an average diameter (D) in the range from 40 nm to 300 nm, an average height (H) in the range from 100 nm to 500 nm, and an average pitch (P) in the range from 50 nm to 300 nm.

Figure 18:
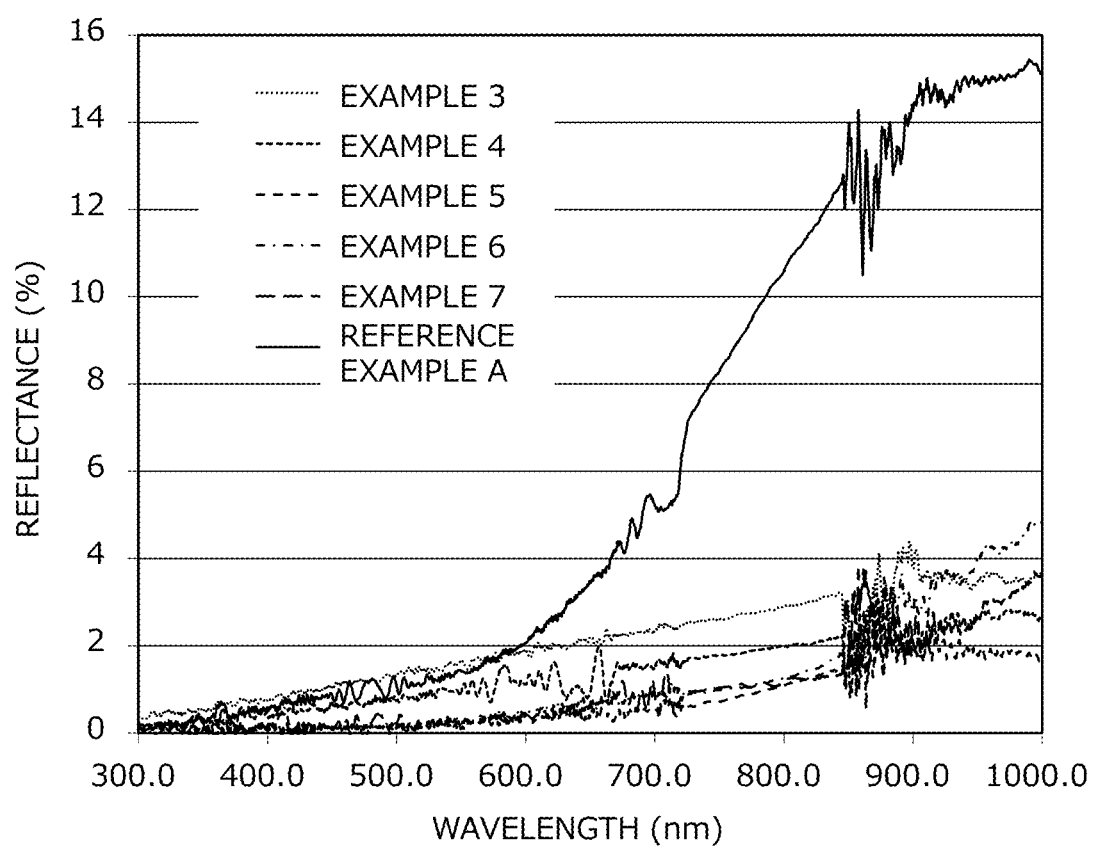
FIG. 18 is a graph showing reflectance of the moth-eye transfer molds of the samples according to Examples 3 to 7.
Figure 19:
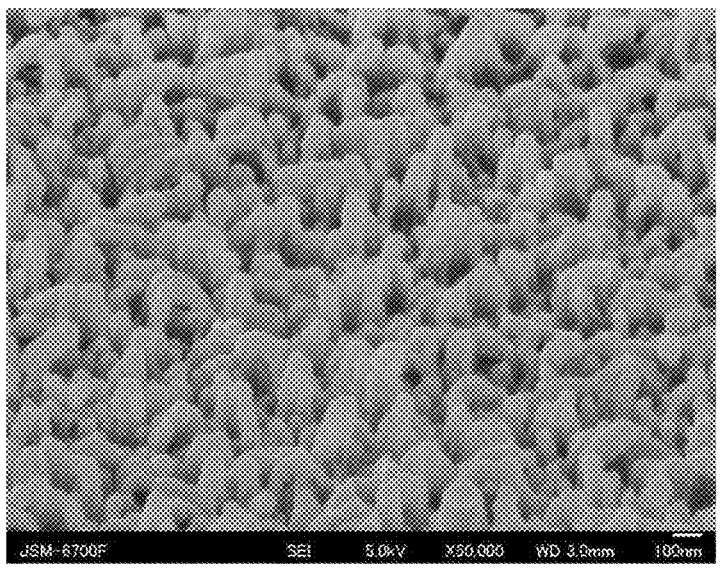
FIG. 19 shows electron micrographs of a moth-eye structure transferred using the moth-eye transfer mold of the sample according to Example 3.
Figure 19:
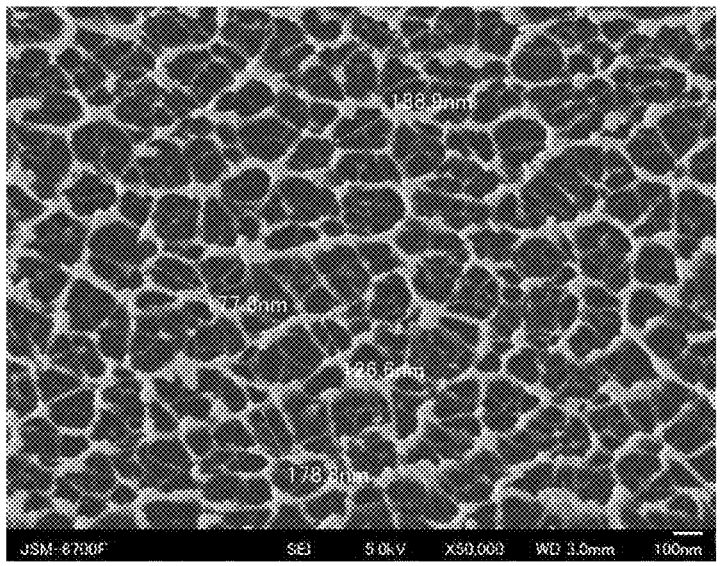
Figure 20:
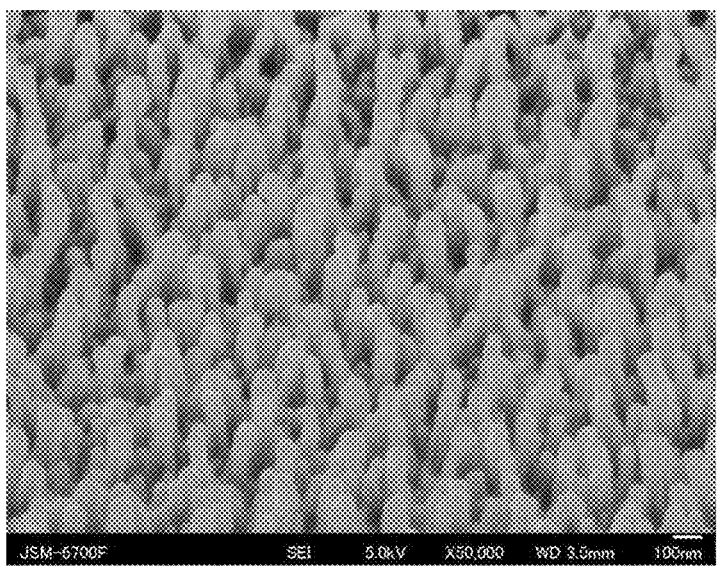
FIG. 20 shows electron micrographs of a moth-eye structure transferred using the moth-eye transfer mold of the sample according to Example 4.
Figure 20:
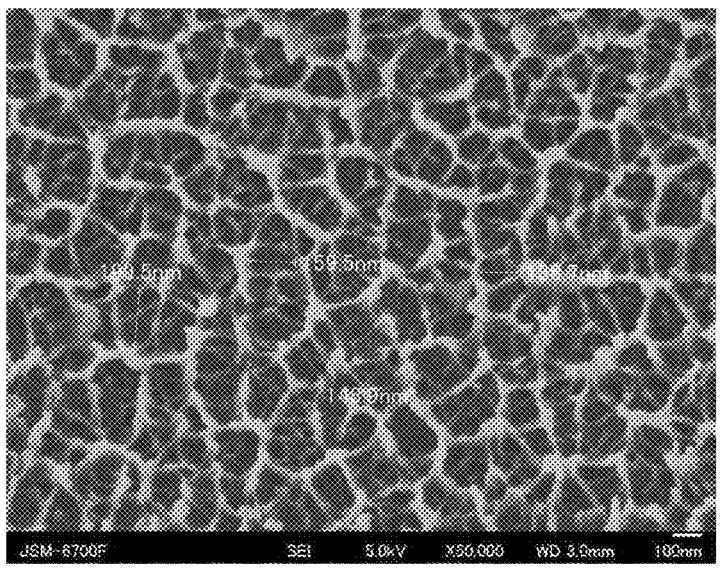
Figure 21:
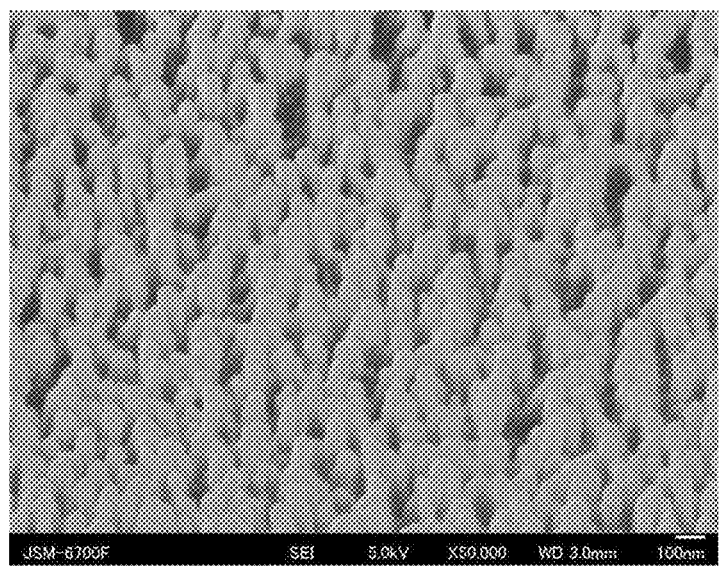
FIG. 21 shows electron micrographs of a moth-eye structure transferred using the moth-eye transfer mold of the sample according to Example 5.
Figure 21:
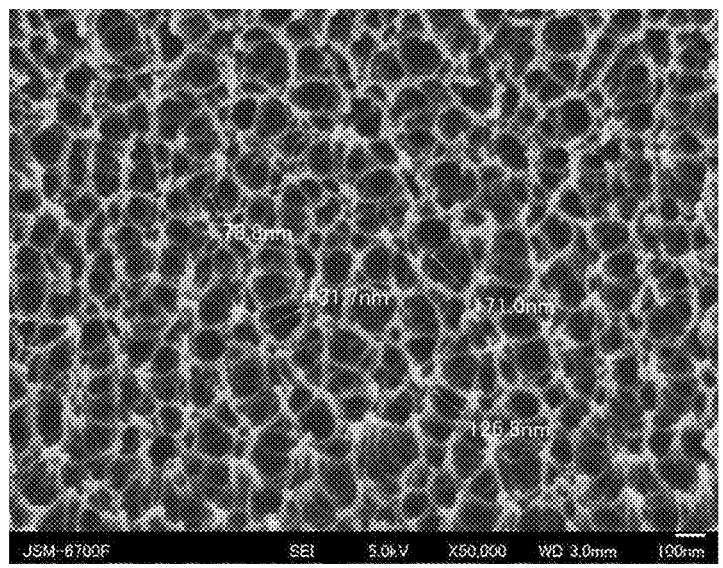
Figure 22:
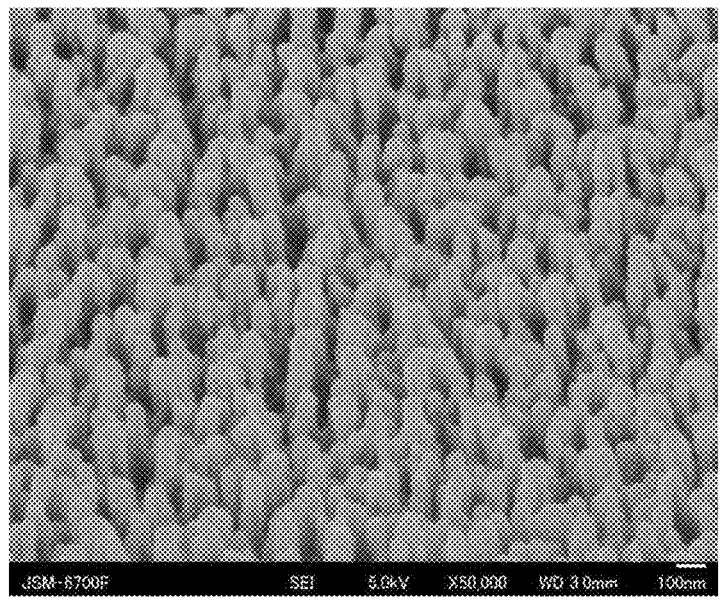
FIG. 22 shows electron micrographs of a moth-eye structure transferred using the moth-eye transfer mold of the sample according to Example 6.
Figure 22:
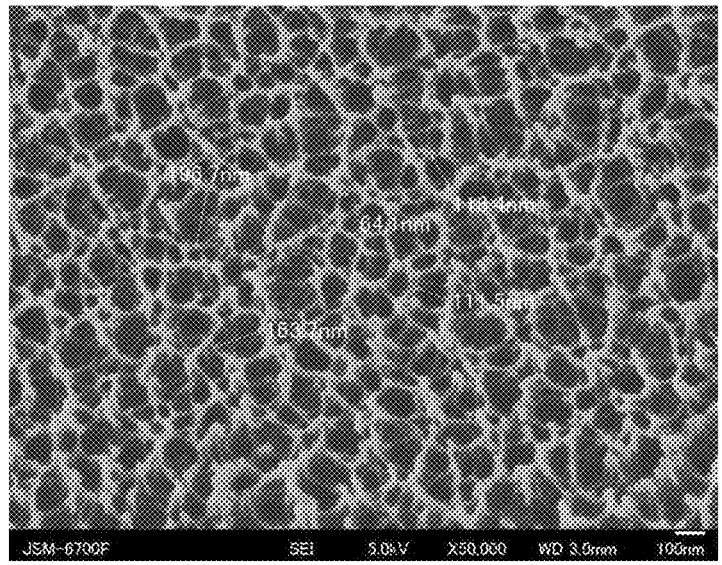
Figure 23:
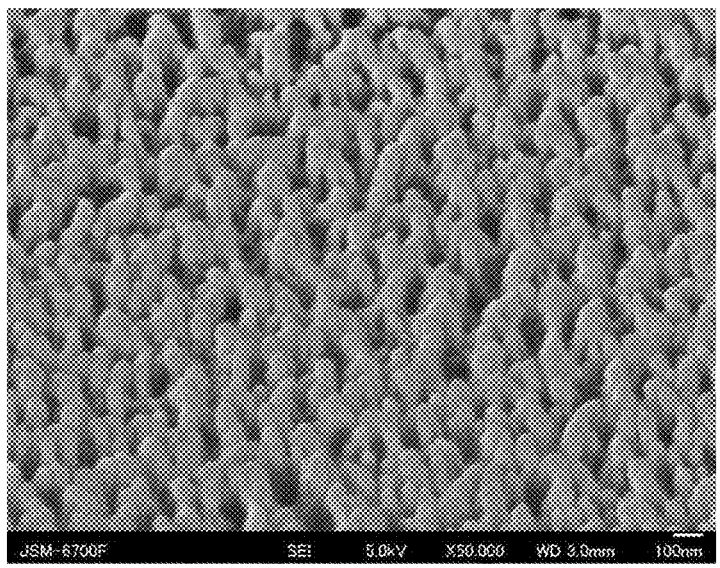
FIG. 23 shows electron micrographs of a moth-eye structure transferred using the moth-eye transfer mold of the sample according to Example 7.
Figure 23:
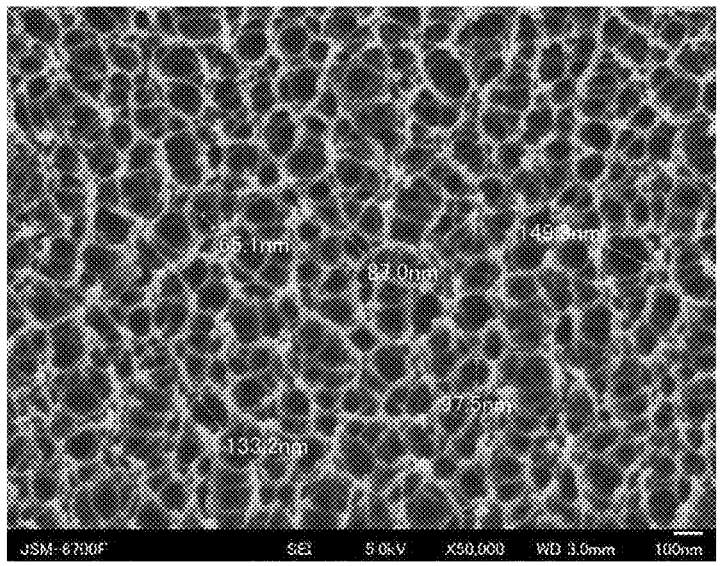

FIG. 18 shows the results of measuring the reflectance of the surfaces of the moth-eye transfer molds according to Example 3 to Example 7 in a wavelength region of 300 nm to 1,000 nm with a spectrophotometer (manufactured by SHIMADZU CORPORATION, UV-3100PC). As a reference example, a sample (Reference Example A) with a processing time of 200 seconds is also plotted.

As shown in FIG. 18, the reflectance of the surfaces of the moth-eye transfer molds according to Example 3 to Example 7 was 5% or less at 300 nm to 1,000 nm. On the other hand, in the sample according to Reference Example A, the reflectance greatly increases at 700 nm or more and was more than 5%.

In addition, Table 3 shows the results of measuring the contact angles on the surfaces of the moth-eye transfer molds according to Example 3 to Example 7 and Reference Example A at 25° C. with the contact angle meter (manufactured by Kyowa Interface Science Co., Ltd., model number CA-X). Table 3 shows water contact angles before plasma processing, after plasma processing, and after mold release treatment. As a mold release material, a fluorine mold releasing agent (manufactured by Daikin Industries, product name: UD-509) was used.

TABLE 3

| | | Water contact angle (°) | | |
|---|---|---|---|---|
| | Processing time | Before plasma processing | After plasma processing | After mold release treatment |
| Example 3 | 80 seconds | 17.8 | 4.9 | 147.3 |
| Example 4 | 100 seconds | 12.8 | 3.8 | 151.1 |
| Example 5 | 150 seconds | 17.2 | 3.8 | 150.9 |
| Example 6 | 160 seconds | 20.8 | 3.5 | 154.1 |
| Example 7 | 170 seconds | 25.6 | 3.6 | 152.2 |
| Reference Example A | 200 seconds | 22.8 | 3.5 | 149.9 |

The water contact angles on the surfaces of the moth-eye transfer molds according to Example 3 to Example 7 after plasma processing were as small as not less than 3.5° and not more than 4.9°. The water contact angles after mold release treatment were as large as not less than 147.3° and not more than 154.1°.

Using the moth-eye transfer molds according to Example 3 to Example 7, the moth-eye structures were transferred in the same manner as in Test 3 to obtain the TAC films provided with the moth-eye structures (surface microstructures).

Evaluation of the transferred moth-eye structures according to Example 3 to Example 7 was performed in the same manner as in Test 4. Specifically, the transferred moth-eye structures were subjected to surface state observation, contact angle evaluation, haze (haze value) measurement, and spectroscopic measurement.

FIG. 19 to FIG. 23 show electron micrographs each showing the moth-eye structure transferred using the moth-eye transfer mold of each sample. Table 4 shows the results of measuring an average diameter and average pitch of the moth-eye structures for the samples according to Example 3 to Example 7.

TABLE 4

| | Processing time | Average diameter (D) | Average pitch (P) |
|---|---|---|---|
| Example 3 | 80 seconds | 87.9 nm to 92.6 nm | 126.6 nm to 188.9 nm |
| Example 5 | 150 seconds | 44.4 nm to 50.0 nm | 78.8 nm to 171.0 nm |
| Example 7 | 170 seconds | 38.9 nm to 46.3 nm | 65.1 nm to 149.3 nm |

As shown in the above results, the moth-eye structure formed by the cured photocurable resin was transferred to the surface of the TAC film. The moth-eye structure was formed by randomly arranged minute protrusions having a needle shape or cone shape whose diameter decreased from the root toward the tip and whose tip was sharpened. The protrusions constituting the moth-eye structure have an average diameter (D) in the range from 30 nm to 100 nm and an average pitch (P) in the range from 60 nm to 200 nm.

The contact angle and haze value of each sample are shown in Table 5 below. Table 5 also shows the contact angle and haze value of a sample (Reference Example A) with a processing time of 200 seconds as a reference example.

TABLE 5

| Processing time | Water contact angle (°) | Haze | value (%) |
|---|---|---|---|
| Example 3 | 80 seconds | 142.4 | 0.4 |
| Example 4 | 100 seconds | 144.6 | 0.5 |
| Example 5 | 150 seconds | 145.1 | 0.5 |
| Example 6 | 160 seconds | 143.2 | 0.5 |
| Example 7 | 170 seconds | 142.9 | 0.5 |
| Reference Example A | 200 seconds | 128.4 | 0.4 |

Considering the above results together with the shape of the transferred moth-eye structures, it was found that the plasma irradiation time (processing time) in the etching step is preferably not less than 80 seconds and not more than 170 seconds, and particularly preferably not less than 150 and not more than 170 seconds. When the plasma irradiation time (processing time) was 200 seconds or more, roughness was observed on the surface of the TAC film.

Figure 24:
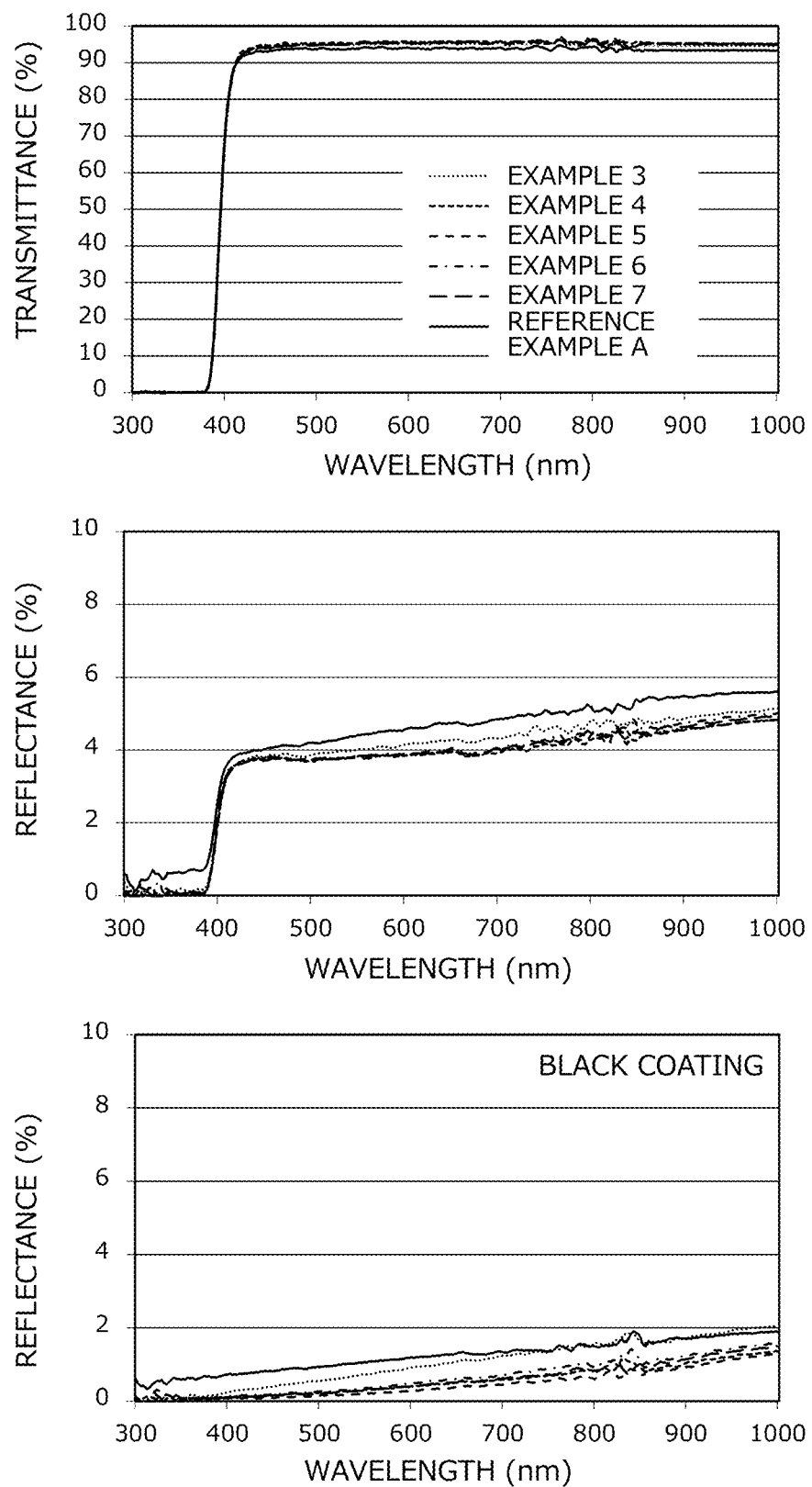
FIG. 24 shows graphs representing results of spectroscopic measurement of the moth-eye structures transferred using the moth-eye transfer molds of the samples according to Examples 3 to 7 (TAC film thickness=120 μm).
Figure 25:
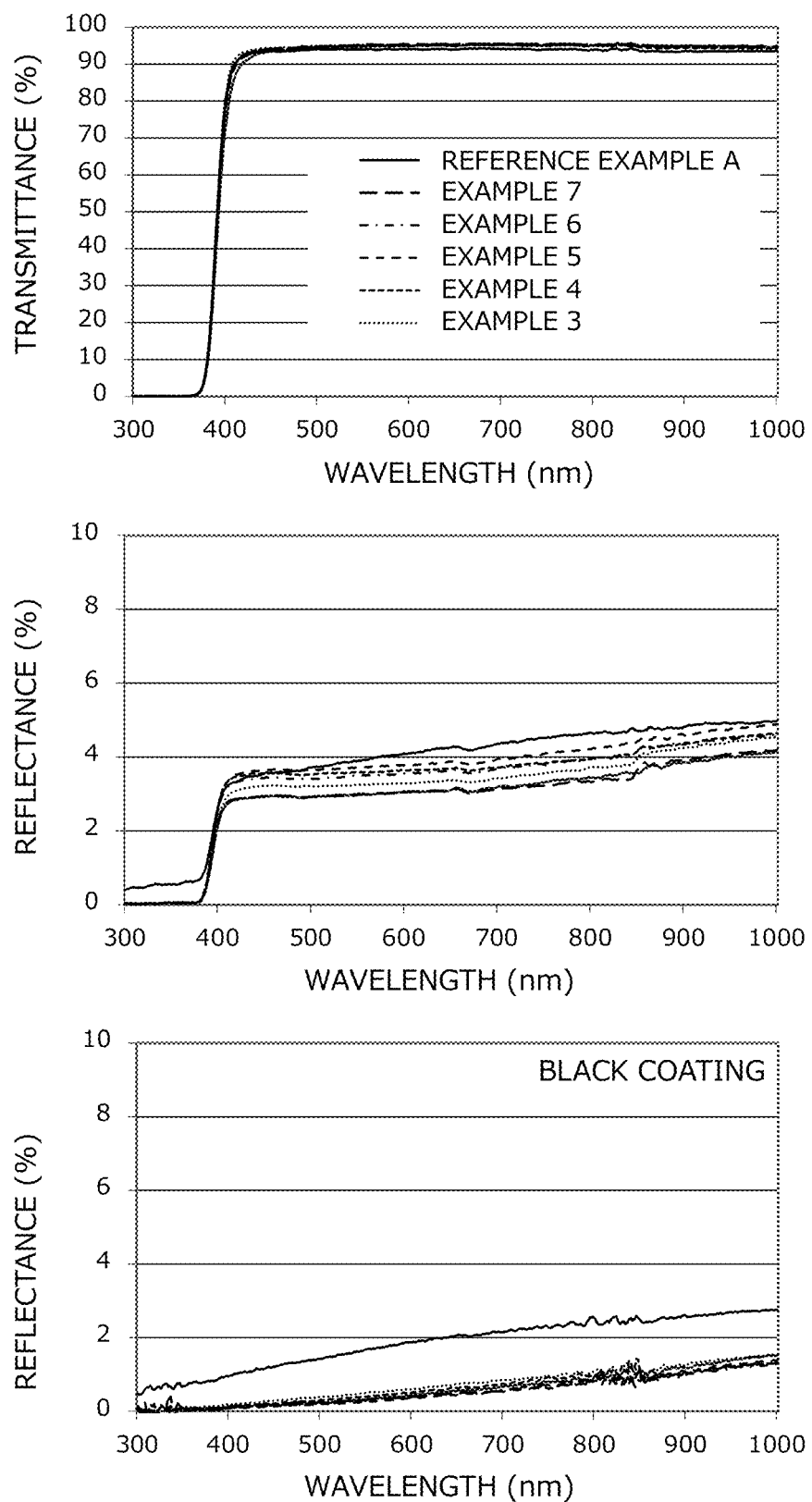
FIG. 25 shows graphs representing results of spectroscopic measurement of the moth-eye structures transferred using the moth-eye transfer molds of the samples according to Examples 3 to 7 (TAC film thickness=60 μm).

The results of the spectroscopic measurement for each sample are shown in FIG. 24 (TAC film thickness=120 μm) and FIG. 25 (TAC film thickness=60 μm).

As shown in FIG. 24 and FIG. 25, the transmittance was not less than 90% and not more than 95% and the reflectance was 6% or less in a wavelength range of 400 nm to 1,000 nm. In addition, when a surface of the TAC film opposite to a surface where the moth-eye structure is formed is coated in black, in order to eliminate TAC film surface reflection, the reflectance was as low as 2% or less in a wavelength range of 400 nm to 1,000 nm, as shown in the lowest graph of FIG. 24 and the lowest graph of FIG. 25.

REFERENCE SIGNS LIST

1: MOTH-EYE TRANSFER MOLD
10: BASE
10*a*: BASE SURFACE
20: UNDERLAYER
30: GLASSY CARBON LAYER
30*a*: SURFACE OF GLASSY CARBON LAYER
RM: INVERTED MOTH-EYE STRUCTURE
200: ARTICLE WITH SURFACE MICROSTRUCTURE
100: WORK (ARTICLE)
100*a*: WORK SURFACE
M: SURFACE MICROSTRUCTURE (MOTH-EYE STRUCTURE)

The invention claimed is:

1. A method of manufacturing a moth-eye transfer mold, characterized by comprising:
a base preparation step of preparing a base, wherein the base comprises one or more substances selected from the group consisting of resin, glass, metal, alloy, ceramics, a silicon wafer, a compound semiconductor, silicon carbide, and a solar cell material;
an underlayer forming step of forming an underlayer on the base, wherein the underlayer comprises one or more substances selected from the group consisting of metal, alloy, ceramics, and silicon;
a glass-like carbon layer deposition step of depositing a glass-like carbon layer on the underlayer by a sputtering method; and
an etching step of etching the glass-like carbon layer with an oxygen ion beam or oxygen plasma to form a microstructure which has an average diameter of 10 nm to 400 nm, an average height of 30 nm to 1,000 nm, and an average pitch of 10 nm to 500 nm on a surface of the glass-like carbon layer,
wherein
in the glass-like carbon layer deposition step,
the sputtering method is performed with DC power supply to a glass-like carbon target to deposit the glass-like carbon layer on the underlayer to a thickness not less than 300 nm and not more than 5 μm, and
the DC power supply is not less than 0.5 kW and not more than 3 kW, temperature is about 25° C., and deposition pressure is 1.0 Pa or less; and
in the etching step,
high frequency power output and bias power output of an ion beam processor for the oxygen ion beam or a plasma processor for the oxygen plasma are adjusted to apply acceleration voltage to oxygen ions,
an oxygen flow rate of not less than 30 SCCM and not more than 60 SCCM,
the high frequency power output is not less than 300 W and not more than 700 W, the bias power output is not less than 30 W and not more than 70 W, and
processing time is not less than 80 seconds and not more than 170 seconds.

2. A method of transferring a moth-eye structure, characterized by comprising:
a moth-eye transfer mold manufacturing step of manufacturing the moth-eye transfer mold according to claim 1;
a step of preparing a work;
a step of irradiating a photocurable resin with light, with the photocurable resin interposed between the moth-eye transfer mold and a surface of the work, thereby curing the photocurable resin; and
a step of peeling off the moth-eye transfer mold from a surface microstructure which is formed by the cured photocurable resin.

3. The method of transferring a moth-eye structure according to claim 2, wherein
the moth-eye transfer mold has a shape comprising one or more shapes selected from the group consisting of a roll shape, a flat plate shape, and an irregular shape.

* * * * *